United States Patent

Harada et al.

[11] Patent Number: 6,013,940
[45] Date of Patent: Jan. 11, 2000

[54] POLY-CRYSTALLINE SILICON FILM LADDER RESISTOR

[75] Inventors: Hirofumi Harada; Jun Osanai; Yoshikazu Kojima; Yutaka Saitoh, all of Chiba, Japan

[73] Assignee: Seiko Instruments Inc., Japan

[21] Appl. No.: 08/516,627

[22] Filed: Aug. 18, 1995

[30] Foreign Application Priority Data

| Aug. 19, 1994 | [JP] | Japan | 6-195758 |
| May 11, 1995 | [JP] | Japan | 7-113446 |
| Jun. 2, 1995 | [JP] | Japan | 7-136964 |
| Jun. 2, 1995 | [JP] | Japan | 7-136965 |
| Aug. 11, 1995 | [JP] | Japan | 7-205900 |

[51] Int. Cl.$^7$ .................................................. H01L 29/00
[52] U.S. Cl. ............................................. 257/538; 257/536
[58] Field of Search ........................... 257/380, 381, 257/536, 538

[56] References Cited

U.S. PATENT DOCUMENTS

| 3,570,114 | 3/1971 | Bean et al. | 257/538 |
| 3,864,817 | 2/1975 | Lapham, Jr. et al. | 257/538 |
| 4,358,326 | 11/1982 | Doo | 257/756 |
| 4,467,519 | 8/1984 | Glang et al. | 438/330 |
| 5,449,934 | 9/1995 | Shono et al. | 257/295 |
| 5,510,642 | 4/1996 | Ogawa | 257/381 |
| 5,589,702 | 12/1996 | Alter | 257/538 |

FOREIGN PATENT DOCUMENTS

| 327078 | 8/1989 | European Pat. Off. | 257/538 |
| 62-69240 | 3/1987 | Japan | 257/538 |
| 63-50054 | 3/1988 | Japan | 257/538 |
| 63-80566 | 4/1988 | Japan | 257/538 |
| 1-94648 | 4/1989 | Japan | 257/538 |
| 1-253950 | 10/1989 | Japan | 257/538 |
| 6-195758 | 8/1994 | Japan . | |
| 7-113446 | 5/1995 | Japan . | |
| 7-136964 | 6/1995 | Japan . | |
| 7-136965 | 6/1995 | Japan . | |
| 7-205900 | 8/1995 | Japan . | |

*Primary Examiner*—John Guay
*Attorney, Agent, or Firm*—Adams & Wilks

[57] ABSTRACT

A resistor ladder network may be formed with a reduced space on a semiconductor substrate by patterning a plurality of layers of resistive polycrystalline silicon films spaced by insulating layers. Such a device includes a first insulating film formed on a semiconductor substrate, one or more serial-connected first resistors formed in a first polycrystalline silicon film provided on the semiconductor substrate via the first insulating film, a second insulating film provided on the first polycrystalline silicon film, one or more series-connected second resistors formed in a second polycrystalline silicon film provided apart from the first polycrystalline silicon film via the second insulating film, the second polycrystalline silicon film being connected to the first polycrystalline silicon film. A third insulating film is provided over the second polycrystalline silicon film, and metal wires provided on a surface of the second polycrystalline silicon film via contact holes formed in the third insulating film. Preferably, the first polycrystalline silicon film is thicker than the second polycrystalline silicon film, the impurity concentration of the first polycrystalline silicon film is lower than the impurity concentration of the second polycrystalline silicon film, and the grain size of the first polycrystalline silicon film is smaller than that of the second polycrystalline silicon film.

39 Claims, 27 Drawing Sheets

Fig. 7

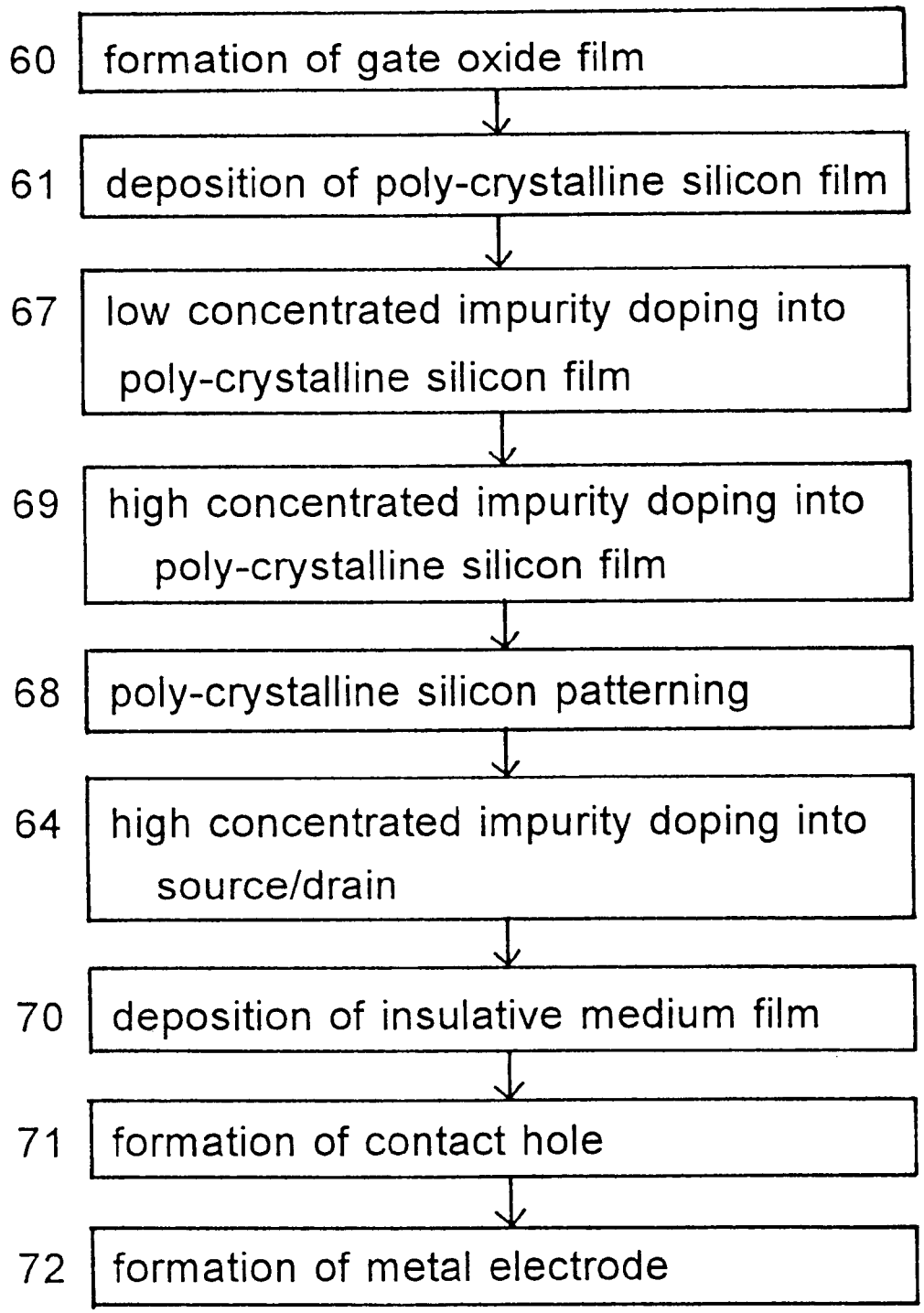

| | |
|---|---|
| 60 | formation of gate oxide film |
| 61 | deposition of poly-crystalline silicon film |
| 67 | low concentrated impurity doping into poly-crystalline silicon film |
| 69 | high concentrated impurity doping into poly-crystalline silicon film |
| 68 | poly-crystalline silicon patterning |
| 64 | high concentrated impurity doping into source/drain |
| 70 | deposition of insulative medium film |
| 71 | formation of contact hole |
| 72 | formation of metal electrode |

POLY-CRYSTALLINE SILICON FILM LADDER RESISTOR

BACKGROUND OF THE INVENTION

The present invention relates to a ladder resistor circuit made from a multi-layered poly-crystalline silicon film and a semiconductor device comprising the ladder resistor, a transistor and a capacitor.

FIG. 31 is a process block diagram of a prior art manufacturing method for fabricating an insulated gate field effect transistor and a ladder resistor circuit used for a semiconductor device. At first, a gate oxide film of the insulated gate field effect transistor is formed (Step 107) and then the poly-crystalline silicon film is deposited by LPCVD (Step 108). This poly-crystalline silicon film is formed so as to have a thickness from 2000 A to 4000 A to use as a gate electrode of the MISFET. Next, in order to determine a resistance value of the poly-crystalline silicon, an impurity having a concentration of $10^{15}$ to $5\times10^{19}$ atoms/cm$^3$ is ion-implanted (Step 109). Then, a high-concentrate impurity is implanted to parts of the poly-crystalline silicon film by means of thermal diffusion in 850 to 950° C. (Step 110). The concentration of this impurity is more than $10^{20}$ atoms/cm$^3$ and a resistance value of the poly-crystalline silicon film per unit length and unit width, i.e. a sheet resistance, is as low as less than 100 $\Omega/\square$. It is implanted to the locations which require a low resistance, including a part where the gate electrode of the insulated gate field effect transistor is formed and a part for contacting with a metal wire at the edge of a high-resistance poly-crystalline silicon resistor having more than 1 k $\Omega/\square$ of sheet resistance.

Next, this poly-crystalline silicon is patterned into shapes of a gate electrode, a resistor or the like (Step 111). Then, an impurity is implanted to a source/drain area of the insulated gate field effect transistor by means of ion implantation (Step 112). The concentration of the impurity is as high as more than $10^{20}$ atoms/cm$^3$.

Next, an intermediate insulating film is formed on the poly-crystalline silicon (Step 113) and contact holes are created on the poly-crystalline silicon film and the substrate on which the source/drain is formed (Step 114). After that, metal wires for electrically connecting each part of the circuit are formed (Step 115). Generally, this metal wire is an aluminum wire.

However, the prior art ladder resistor circuit has had the following problems:

(1) When it is designed so as to have a large resistance value, the length of the resistor has to be prolonged in proportion to that. Due to that, the chip size becomes large, disallowing to supply a low cost circuit; and (2) If the gate electrode of the insulated gate field effect transistor and the thin film of the ladder resistor provided on the same substrate are to be formed in combination, the area of the ladder resistor becomes large, increasing the cost similarly.

Accordingly, in order to solve such problems of the prior art, the present invention aims at increasing a resistance value per unit area and along that, at miniaturizing a chip size, at lowering the cost, at increasing an accuracy and at integrating a transistor and a capacitor.

SUMMARY OF THE INVENTION

In order to solve the aforementioned problems, a ladder resistor circuit of the present invention comprises a first resistor made from a first poly-crystalline silicon film provided on the surface of a substrate and a second resistor made from a second poly-crystalline silicon film provided apart from the first resistor via an interlayer insulating film.

Further, in a semiconductor device comprising a ladder resistor circuit and an insulated gate field effect transistor, a gate electrode of the insulated gate field effect transistor is formed out of the first or second poly-crystalline silicon film.

A manufacturing method of the semiconductor device comprises steps of: forming an insulating film on a substrate; forming a 2000 to 4000 Å first poly-crystalline silicon thin film on the insulating film; doping an impurity having more than $10^{20}$ atoms/cm$^3$ of concentration to the first poly-crystalline silicon film; forming a first poly-crystalline silicon film element area by etching the first poly-crystalline silicon film; forming a 1000 to 4000 Å NSG (Nondoped Silicate Glass) thin film on the surface of the substrate including the first poly-crystalline silicon film area; forming a 100 to 1000 Å second poly-crystalline silicon film on the NSG film; doping a low-concentration impurity having $10^{15}$ to $5\times10^{19}$ atoms/cm$^3$ of concentration to the second poly-crystalline silicon film element area by etching the second poly-crystalline silicon film; doping a high-concentrate impurity having more than $10^{20}$ atoms/cm$^3$ of concentration to a selected part of the poly-crystalline silicon films; forming an intermediate insulating film on the NSG film and the second poly-crystalline silicon film; creating contact holes through the intermediate insulating film to the first and second poly-crystalline silicon films; and providing metal wires on the contact holes.

Another manufacturing method of the semiconductor device comprises steps of: forming an insulating film on a substrate; forming 2000 to 4000 Å of first poly-crystalline silicon film on the insulating film; doping a high-concentrate impurity having more than $10^{20}$ atoms/cm$^3$ of concentration to the first poly-crystalline silicon film; forming a first poly-crystalline silicon film area by etching the first poly-crystalline silicon film; forming 200 to 700 Å of thermal oxide film on the surface of the substrate including the first poly-crystalline silicon film area; forming 100 to 1000 Å of second poly-crystalline silicon film on the thermal oxide film; doping an impurity having $10^{15}$ to $5\times10^{19}$ atoms/cm$^3$ of concentration to the second poly-crystalline silicon film; forming a second poly-crystalline silicon film area by etching the second poly-crystalline silicon film; doping a high-concentrate impurity having more than $10^{20}$ atoms/cm$^3$ of concentration to a part of the poly-crystalline silicon film areas; forming an intermediate insulating film on the thermal oxide film and the second poly-crystalline silicon film; creating contact holes through the intermediate insulating film on the first and second poly-crystalline silicon films; and providing metal wires on the contact holes.

A semiconductor device equipped with a resistor ladder in which a plurality of resistor elements are connected in series via metal electrodes is formed. The resistor ladder has first and second resistance films separated from each other via an insulating film on the surface of a substrate, a high-resistance poly-crystalline silicon film connected between the first and second resistance films, and the metal electrodes provided on the first and second resistance films.

A semiconductor device equipped with a ladder resistor in which a plurality of resistor elements are connected in series via metal wires is formed. The resistor element comprises second conductivity type low-resistance impurity areas separated from each other on the surface of a first conductivity type semiconductor area, a high-resistance poly-crystalline silicon film connected between the first and second low-resistance impurity areas and provided on the semiconductor area via an insulating film, and the metal electrodes provided on the first and second low-resistance impurity areas.

The semiconductor device also includes an insulated gate field effect transistor using the first-layer poly-crystalline silicon film provided on the surface of the substrate or the second-layer poly-crystalline silicon film provided from the first-layer poly-crystalline silicon film via the interlayer insulating film as its gate electrode, a capacitor using the first-layer poly-crystalline silicon film or the second-layer poly-crystalline silicon film as its electrode and a ladder resistor circuit comprising first resistors made from the first-layer poly-crystalline silicon film and second resistors made from the second poly-crystalline silicon film and contact holes for electrically connecting the insulated gate field effect transistor with the resistors, the resistors with the capacitor or the capacitor with the insulated gate field effect transistor are formed across the first and second-layer poly-crystalline silicon films.

It also includes a ladder resistor circuit comprising first resistors made from the first-layer poly-crystalline silicon film and second resistors made from the second-layer poly-crystalline silicon film provided from the first resistors via an insulating film and contact holes for electrically connecting the first and second resistors are created across the first and second-layer poly-crystalline silicon films.

A via hole is created through the interlayer insulating film and through that, the first and second-layer poly-crystalline silicon films described above are directly connected.

Further, a via hole is created through the interlayer insulating film and through that, the first and second resistors described above are directly connected.

A semiconductor device in which a plurality of resistor elements are electrically connected in series via metal wires is formed. The resistor element comprises a first poly-crystalline silicon film provided on the surface of a substrate via an insulating film, second poly-crystalline silicon films connected at the both ends of the first poly-crystalline silicon film and metal wires provided on the surface of the second poly-crystalline silicon film via contact holes and is adapted so that a thickness of the first poly-crystalline silicon film is thinner than that of the second poly-crystalline silicon film, an impurity concentration of the second poly-crystalline silicon film is lower than that of the first poly-crystalline silicon film and a grain size of the second poly-crystalline silicon film is smaller than that of the first poly-crystalline silicon film.

Another manufacturing method of a semiconductor device is adapted to comprise steps of: forming an insulating film on a substrate; forming a first poly-crystalline silicon film on the insulating film; doping a high-concentrate first conductive impurity to the first poly-crystalline silicon film; forming a first poly-crystalline silicon film area by etching the first poly-crystalline silicon film; forming a second poly-crystalline silicon film which is thinner than the first poly-crystalline silicon film on the surface of the substrate including the first poly-crystalline silicon film area; doping a low-concentrate first conductive impurity to the second poly-crystalline silicon film; patterning the first poly-crystalline silicon films apart on the both sides of the second poly-crystalline silicon film by selectively etching the second poly-crystalline silicon film and the second poly-crystalline silicon film; forming an intermediate insulating film on the first and second poly-crystalline silicon films; creating contact holes through the intermediate insulating film on the second poly-crystalline silicon film; and providing metal wires on the contact holes.

The semiconductor device is formed so as to comprise the first poly-crystalline silicon film, the interlayer insulating film, the second poly-crystalline silicon film, an insulated gate field effect transistor whose gate electrode is formed out of the first poly-crystalline silicon film whose thickness is from 2000 to 4000 Å and whose impurity concentration is more than $10^{20}$ atoms/cm$^3$, and a ladder resistor made from the second poly-crystalline silicon film.

The semiconductor device is characterized in that the second poly-crystalline silicon film described above is thinner than the first poly-crystalline silicon film.

The semiconductor device is characterized in that a thickness of the second poly-crystalline silicon film described above is from 100 to 1000 Å and its impurity concentration is from $10^{15}$ to $5 \times 10^{19}$ atoms/cm$^3$.

The semiconductor device is characterized in that the interlayer insulating film described above is an NSG film having 1000 to 4000 Å of thickness.

The semiconductor device is further characterized in that the interlayer insulating film described above is a thermal oxide film being 200 to 700 Å in thickness.

The semiconductor device described above is also characterized in that it includes a reference voltage circuit, a voltage comparison circuit, a voltage dividing circuit and an output circuit, the voltage comparison circuit inputs and compares at least two voltages from the reference voltage circuit and the voltage dividing circuit and outputs a signal which corresponds to a difference of the two voltages to the output circuit, and the voltage dividing circuit is composed of the ladder resistor.

Because the ladder resistor circuit is formed out of the thin poly-crystalline silicon film, a high resistance value may be obtained when an impurity having the same concentration is implanted as compared to a case when the ladder resistor circuit is formed out of a thick poly-crystalline silicon film. Due to that, a length of resistors in the ladder resistor circuit may be shortened and an area necessary for the ladder resistor circuit may be reduced.

Further, because a resistance ratio between the low-resistance section and the high-resistance section may be increased by forming the high-resistance section of the resistor element by a thin film and the low-resistance section (electrode section) by a thick film, the resistance ratio of the ladder resistor circuit may be set accurately.

Still more, because the electrode section is thick, the contact holes may be readily formed.

Further, the poly-crystalline silicon at the low-resistance section may be formed so as to serve also as a gate electrode of an insulated gate field effect transistor.

Because the ladder resistor circuit is formed out of the multi-layered poly-crystalline silicon films, it requires no distance between respective resistors, allowing the area to be reduced.

Then, the reduction of the contact part necessary for connecting the first and second poly-crystalline silicon allows a reduction of the chip area and hence a reduction of the cost.

BRIEF DESCRIPTION OF THE DRAWINGS

FIG. 7 is a block diagram showing steps of a method for manufacturing a resistor element of the semiconductor device of the present invention;

DETAILED DESCRIPTION OF PREFERRED EMBODIMENTS

Preferred embodiments of the present invention will be explained below with reference to the drawings.

Figure 1:
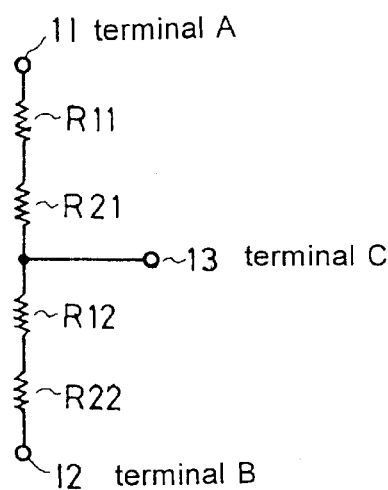
FIG. 1 is a circuit diagram of a ladder resistor circuit of the present invention.

FIG. 1 is a circuit diagram of a ladder resistor circuit of the present invention. A partial voltage $V_0$ of a voltage V applied between terminals A 11 and B 12, which is divided by respective resistors $R_{11}$, $R_{21}$, $R_{12}$ and $R_{22}$, is obtained from a terminal C 13. The resistors $R_{11}$ and $R_{12}$ are formed out of a poly-crystalline silicon film on a first layer and the resistors $R_{21}$ and $R_{22}$ are formed out of a poly-crystalline silicon film on a second layer. The resistors $(R_{11}+R_{21})$ and $(R_{12}+R_{22})$ for obtaining the partial voltage are composed of a sum of resistors of the poly-crystalline silicon film on the first layer and the poly-crystalline silicon film on the second layer.

Accordingly, a desired partial voltage may be obtained even if a specific resistance of the poly-crystalline silicon film on the first layer and the poly-crystalline silicon film on the second layer did not coincide when they were fabricated.

Figure 2:
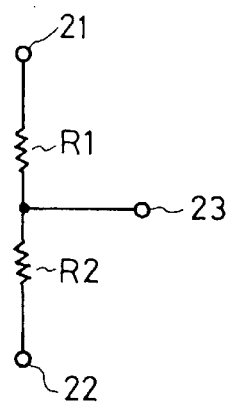
FIG. 2 is a circuit diagram of another embodiment of the ladder resistor circuit of the present invention.

FIG. 2 is a circuit diagram of a ladder resistor circuit of the present invention formed out of a monolayer poly-crystalline silicon film. A partial voltage between a first terminal 21 and a second terminal 22 is obtained from a terminal 23 by forming resistors $R_1$ and $R_2$ by patterning the poly-crystalline silicon film with a length which corresponds to a dividing ratio.

Figure 10:
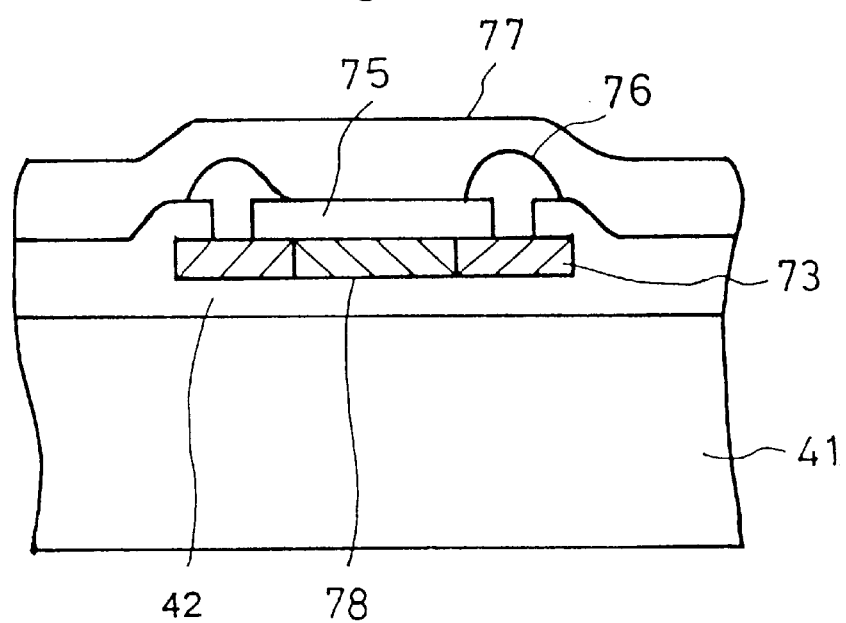
FIG. 10 is a section view of a substrate of another embodiment of the resistor element of the semiconductor device of the present invention.

FIG. 10 is a section view of a resistor element used in the ladder resistor circuit of the present invention.

A poly-crystalline silicon film having a homogeneous thickness is disposed on the surface of a substrate 41 through a field insulating film 42. Both sides of the poly-crystalline silicon film is high-concentrate impurity areas 73 and a high-resistance poly-crystalline silicon film 78, which is a low-concentrate impurity area, is formed therebetween. Metal electrodes 76 are provided via contact holes of an intermediate insulating layer 75 on the high-concentrate impurity areas 73 spaced apart from each other on the both sides of the high-resistance poly-crystalline silicon film 78. A passivation film 77 is also provided thereon covering the whole. The ladder resistor circuit is formed by connecting the plurality of resistor elements shown in FIG. 9 in series via metal wires on the surface of the same substrate.

Figure 3:
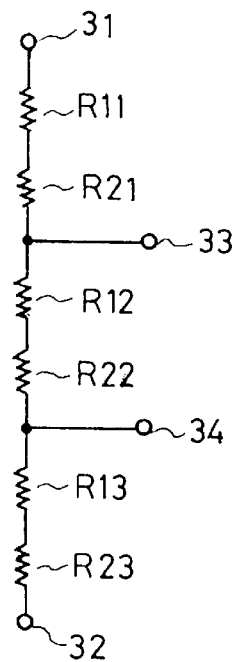
FIG. 3 is a circuit diagram of another embodiment of the ladder resistor circuit of the present invention.

FIG. 3 is a circuit diagram of another embodiment of a ladder resistor circuit for obtaining two partial voltages. The partial voltages of the voltage applied between terminals 31 and 32 are obtained from contact points of terminals 33 and 34. The resistors $(R_{11}+R_{21})$, $(R_{12}+R_{22})$ and $(R_{13}+R_{23})$ for obtaining the partial voltages are composed of resistors of a first poly-crystalline silicon film $(R_{11}, R_{12}, R_{13})$ and a second poly-crystalline silicon film $(R_{21}, R_{22}, R_{23})$ having the same ratio, respectively. That is, the following expression is satisfied:

$$R_{11}+R_{21}{:}R_{12}+R_{22}{:}R_{13}+R_{23}=R_{11}{:}R_{12}{:}R_{13}=R_{21}{:}R_{22}{:}R_{23}$$

Figure 4:
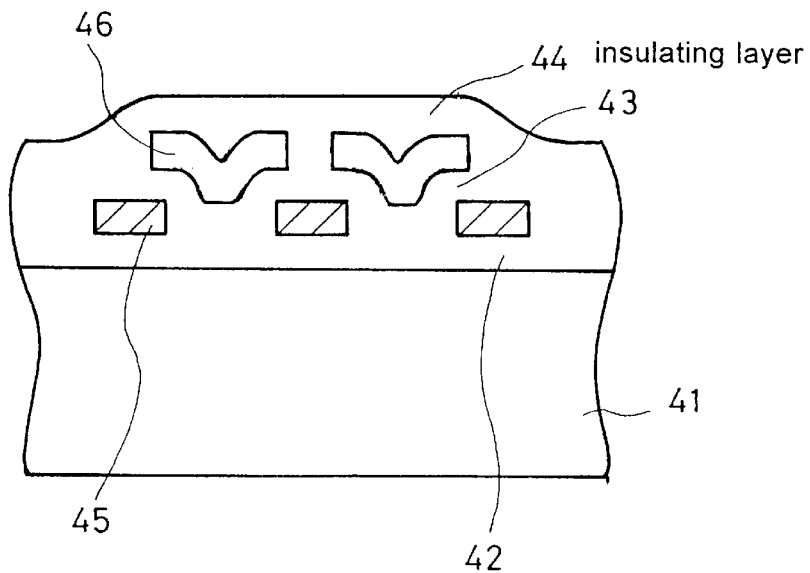
FIG. 4 is a section view of the ladder resistor circuit of the present invention.

FIG. 3 is a drawing showing a sectional structure of the resistors when they are formed by two layers of poly-crystalline silicon film. Resistors 45 of a first layer are formed on a substrate 41 via a field insulating film 42. An interlayer insulating film 43 is provided on the resistor 45 on the first layer. Resistors 46 of a second layer are formed thereon. An insulating layer 44 is formed thereover. As shown in FIG. 4, the resistors 45 of the first layer and the resistors 46 of the second layer are disposed so as to overlap partially or wholly plane-wide. The resistors 45 of the first layer and the resistors 46 of the second layer may be readily designed if they are to be formed to have an equal specific resistance.

However, because they are basically formed out of separate poly-crystalline silicon films, they can be set to have different thicknesses and specific resistances. For example, the resistors 45 of the first layer may be formed by the same process with a gate electrode of an insulated gate field effect transistor (hereinafter abbreviated as MISFET) formed within an integrated circuit and the resistors 46 of the second layer may be formed out of a poly-crystalline silicon film having a very small thickness as compared to that of the first layer. For example, they may be optimized separately so that the thickness of the resistors of the first layer are 2000 to 4000 Å and that of the second layer are 100 to 500 Å.

Figure 5:
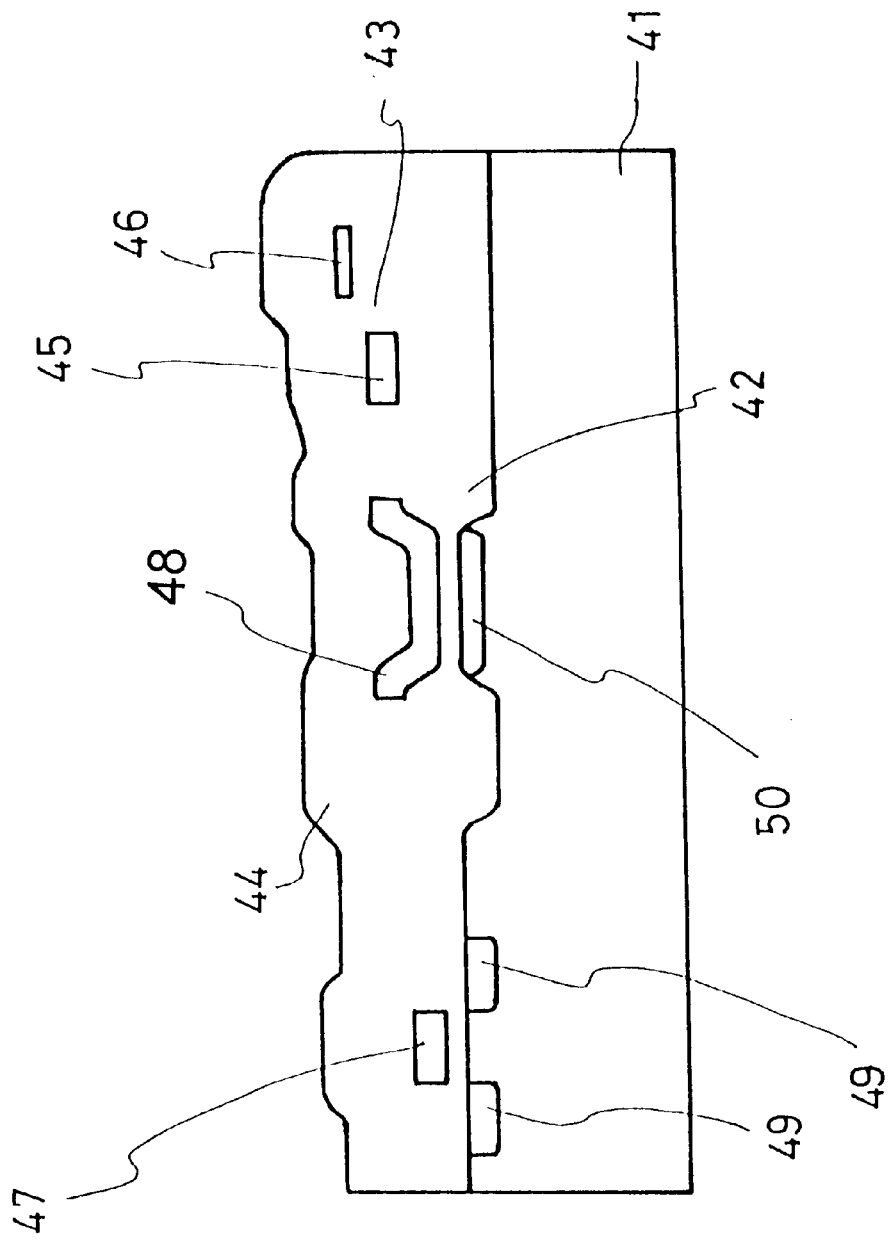
FIG. 5 is a section view when the present invention is applied to a semiconductor device including an insulated gate field effect transistor and a capacitor.

FIG. 5 is a section view of a substrate when the present invention is applied to an integrated circuit device including a MISFEt and a capacitor. The device may be created on the substrate 41 in the same process by using the poly-crystalline silicon films by composing a first resistor 45 formed out of a first poly-crystalline silicon film of the present invention and a second resistor 46 formed out of a second poly-crystalline silicon film via an interlayer insulating film 43. The MISFET may be composed of a gate electrode 47 formed out of the first poly-crystalline silicon film and source/drain area 49 formed in the substrate and a capacitor having a capacitor electrode 48 may be formed out of the first poly-crystalline silicon and a substrate side diffused capacitor electrode 50 electrically separated by an insulating film 44. In FIG. 5, the thickness of the second poly-crystalline silicon film may be thinner than that of the first poly-crystalline silicon film and the resistance value may be arbitrarily defined by the thickness of the poly-crystalline silicon film. Further, although not shown, the capacitor integrated at the same time may be formed by forming the poly-crystalline silicon on the first layer and the poly-crystalline silicon on the second layer as capacitor electrodes.

Figure 6A:
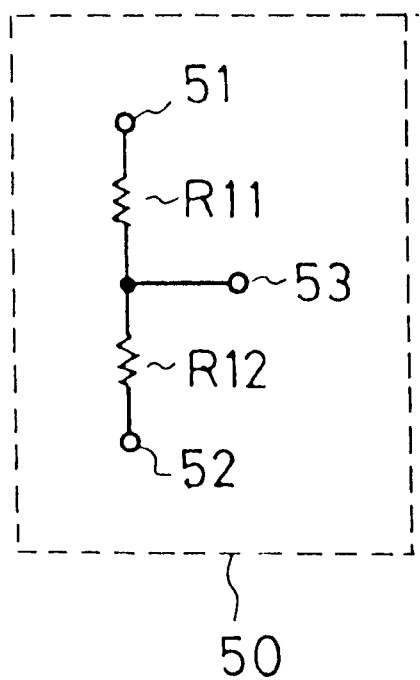
FIG. 6 is a circuit diagram of a ladder resistor circuit according to another embodiment of the present invention.
Figure 6B:
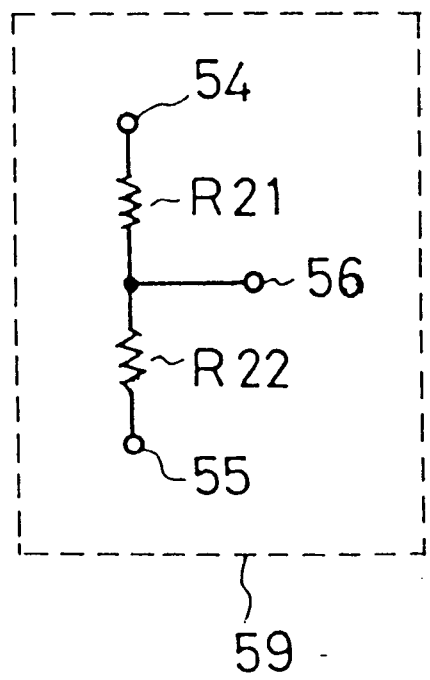

FIGS. 6A and 6B are circuit diagrams of another embodiment in which different ladder resistor circuits are formed by different poly-crystalline silicon films.

Resistors $R_{11}$ and $R_{12}$ in a ladder resistor circuit block 50 in FIG. 6A are formed out of the poly-crystalline silicon on the first layer and resistors $R_{21}$ and $R_{22}$ in a ladder resistor circuit block 59 in FIG. 6b are formed out of the poly-crystalline silicon film on the second layer. Because the ladder resistor circuits are separately formed in the case of FIGS. 6a and 6b, resistance ratios are set separately. A high-resistance resistor film is used for a ladder resistor network which requires to reduce a power consumption of the ladder resistors.

FIG. 7 is a process block diagram showing a main manufacturing method of the present invention for fabricating the insulated gate field effect transistor and the ladder resistor circuit used for the semiconductor device.

At first, after forming a gate oxide film of the MISFET (Step 60), the poly-crystalline silicon film is deposited by LPCVD (Step 61). Because this poly-crystalline silicon is used as a gate electrode of the MISFET, it is formed to be thicker than at least 2000 Å. It is also desirable to be less than 4000 Å in order to prevent a cut of metal wires on the poly-crystalline silicon. Next, a low-concentrate impurity is implanted to determine a resistance value of this poly-crystalline silicon by means of ion implantation (Step 67). The concentration of the impurity is selected to be a value between $10^{15}$ to $5\times10^{19}$ atoms/cm$^3$. The optimum value is $10^{17}$ to $5\times10^{19}$ atoms/cm$^3$. Next, a high-concentrate impurity is implanted to a part of the poly-crystalline silicon film by means of thermal diffusion at 890° C. (Step 69). Its concentration should be more than $10^{20}$ atoms/cm$^3$ and a resistance value of the poly-crystalline silicon film per unit length and unit width, i.e. a sheet resistance, is lowered to be less than 1000 Ω/□ for example. It is implanted to a part which requires a low resistance other than a part which contacts with a metal on the edge of the high-resistance poly-crystalline silicon in the gate electrode or the like of the insulated gate field effect transistor. After patterning this poly-crystalline silicon into the shape of gate electrode and resistors (Step 68), an impurity is implanted to the source/drain of the insulated gate field effect transistor and a part which needs an ohmic contact of the poly-crystalline silicon resistor by means of ion implantation (Step 64). The concentration of this impurity is more than $10^{20}$ atoms/cm$^3$. Next, an intermediate insulating film is formed on the poly-crystalline silicon (Step 70) and contact holes are formed on the poly-crystalline silicon film and on the substrate on which the source/drain or the like are formed (Step 71). After that, metal wires are created to electrically connect each section of the circuit (Step 72). This metal wire is generally an aluminum wire. This method has a merit that because the high-concentrate impurity is not implanted to the end of the high-resistance poly-crystalline silicon by means of thermal diffusion, it diffuses less to the high-concentrate impurity area as compared to the prior art.

Figure 8:
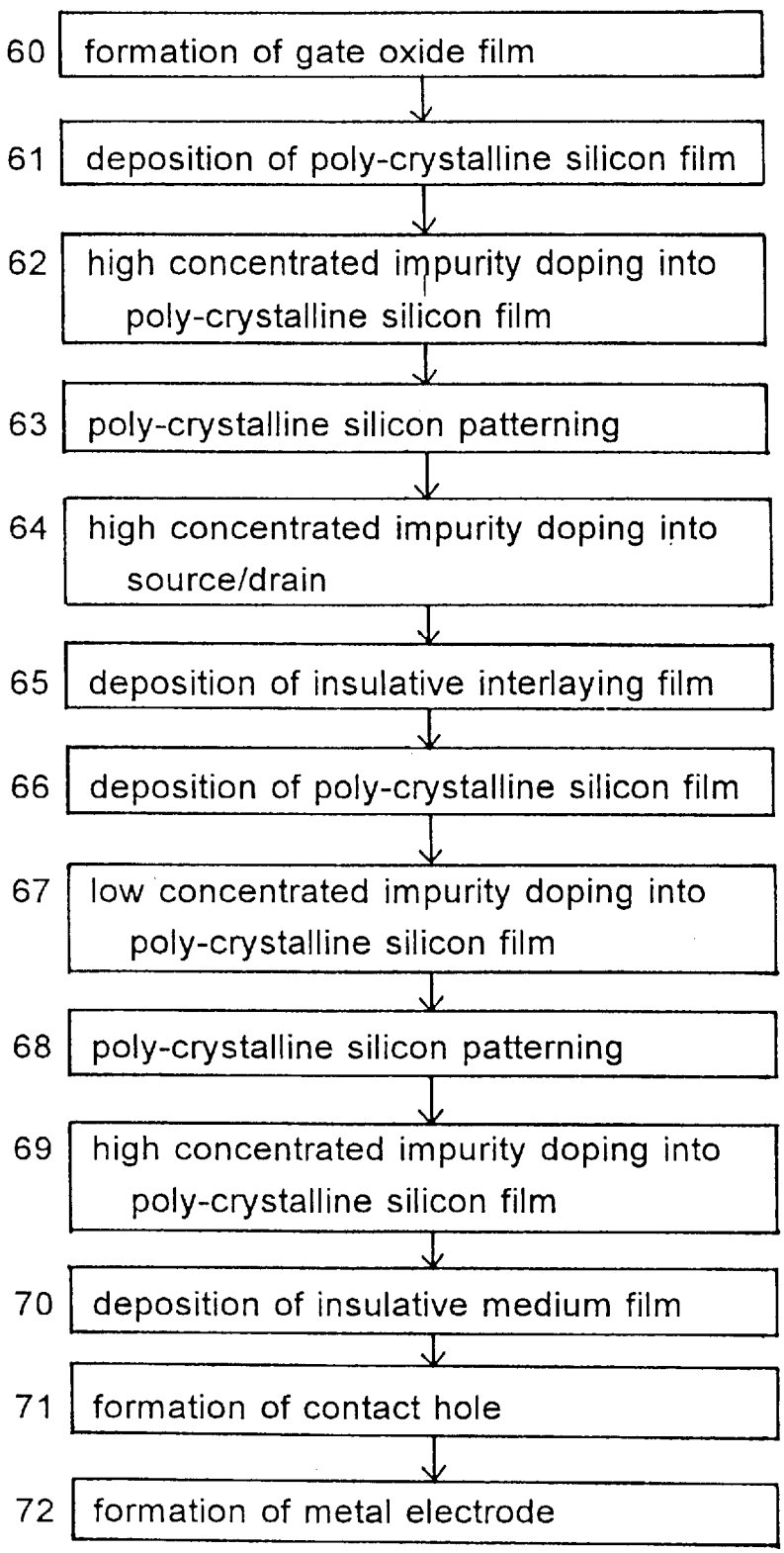
FIG. 8 is a block diagram showing steps of another embodiment of the method for manufacturing the resistor element of the semiconductor device of the present invention.

FIG. 8 is a process block diagram in which the poly-crystalline silicon film on the first layer is used for a gate of a MISFET and the poly-crystalline silicon film on the second layer is used for resistors.

At first, after forming a gate oxide film of the MISFET (Step 60), the poly-crystalline silicon film on the first layer is deposited by LPCVD (Step 61). Because this poly-crystalline silicon is used as a gate electrode of the MISFET, it is formed to be thicker than at least 2000 Å. It is also desirable to be less than 4000 Å in order to prevent a cut of metal wires on the poly-crystalline silicon. Next, a high-concentrate impurity is implanted to the poly-crystalline silicon film by means of ion implantation or impurity diffusion (Step 62). This impurity concentration is more than $10^{20}$ atoms/cm$^3$ and a resistance value of the poly-crystalline silicon film per unit length and unit width, i.e. a sheet resistance, is lowered to 100 Ω/□ for example. Next, after patterning this poly-crystalline silicon into a shape of the gate electrode (Step 63), an impurity is implanted to the source/drain by means of ion implantation from above this poly-crystalline silicon gate (Step 64). Then, while an interlayer insulating film is deposited (Step 65), it is formed by an oxide film formed by means of thermal oxidation or a NSG (Nondoped silicate glass) film by means of CVD method. The thickness is 200 to 700 Å in the case of the thermal oxide film and 1000 to 4000 Å in the case of the NSG film. The thickness of the interlayer insulating film is desirable to be less than 4000 Å to prevent a cut of metal wires at contact hole section and others where the level is different and to prevent an inferior contact etching. In the case of the NSG, the thickness must be more than 1000 Å to prevent a drop of a withstand voltage due to an insufficient coverage and a leak due to a pinhole. When the thermal oxide film is used as the interlayer insulating film, the thickness must be more than 200 Å to prevent a punch-through due to an over-etching during contact etching and an electrical leak between the poly-crystalline silicons on the first and second layers. It is also desirable to be less than 700 Å to avoid a reduction of film of the poly-crystalline silicon due to thermal oxidation and a high energization of the ion implantation implemented through this thermal oxide film. Then, the poly-crystalline silicon film on the second layer is deposited by means of LPCVD (Step 66). Because this second layer poly-crystalline silicon film is used as a resistor having a high resistance, it is formed so as to have 100 to 1000 Å of thickness. Next, an impurity is implanted to determine a resistance value of this poly-crystalline silicon by means of ion implantation (Step 67). The concentration of the impurity is selected to be a value between $10^{15}$ to $5 \times 10^{19}$ atoms/cm$^3$. The optimum value is $10^{17}$ to $5 \times 10^{19}$ atoms/cm$^3$. Next, after patterning this poly-crystalline silicon into the shape of the resistor, (Step 68), a high-concentrate impurity is implanted to a part of the resistor by means of ion implantation to obtain an electrical conductivity (Step 69). Its concentration should be more than $10^{20}$ atoms/cm$^3$ to obtain an ohmic contact. Next, an intermediate insulating film is formed on the poly-crystalline silicon (Step 70) and contact holes are formed on the first and second poly-crystalline silicon films and on the substrate on which the source/drain or the like are formed (Step 71). After that, metal wires are created to electrically connect each section of the circuit (Step 72). This metal wire is generally an aluminum wire.

If the thermal oxide film is selected for the interlayer insulating film between the first-layer and second-layer poly-crystalline silicons, the implantation of the high-concentrate impurity to the source/drain and the implantation of the high-concentrate impurity to the second-layer poly-crystalline silicon may be carried out simultaneously, allowing a reduction of the step of the process. At this time, a sufficient ion implanting energy which allows to implant ions to the source/drain through the thermal oxide film, which is the interlayer insulating film, is selected.

Another structure for forming the poly-crystalline silicon film used for the gate of the MISFET and the poly-crystalline silicon film used for the ladder resistor circuit, respectively having a different thickness, and a manufacturing process of the same will be explained with reference to the drawings.

Figure 9:
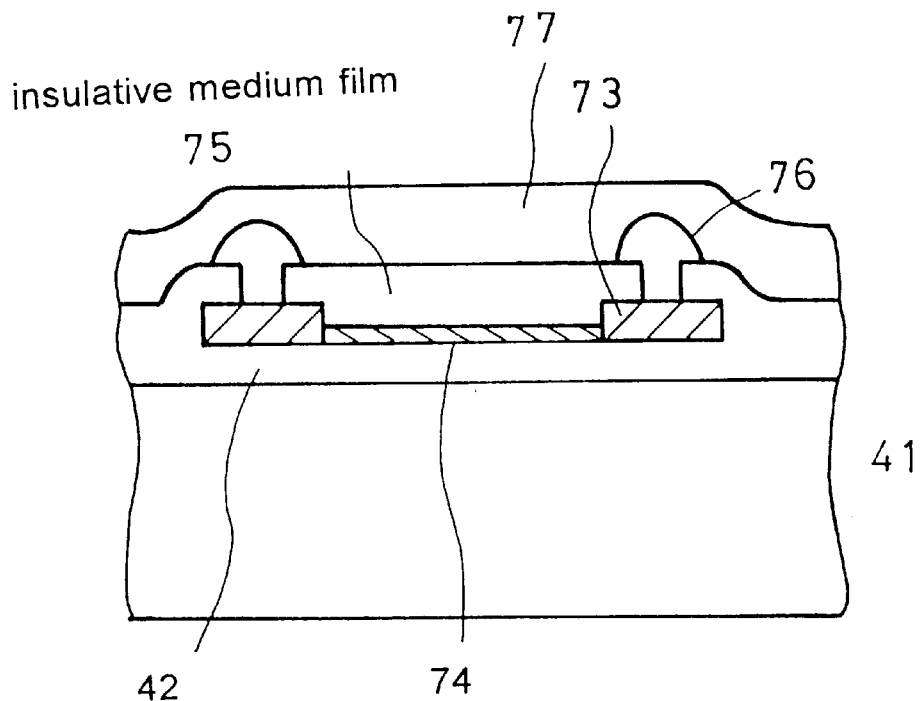
FIG. 9 is a section view of the resistor element of the semiconductor device of the present invention.

FIG. 9 is a section view of a resistor formed so as to have a smaller thickness than that of the gate of the MISFET. A field insulating film 42 is provided on a substrate 41 and a high-resistance poly-crystalline silicon film 74, having a small thickness and a low impurity concentration, is provided on the field insulating film 42. Thick low-resistance poly-crystalline silicon films 73 are provided on the both sides of the high-resistance poly-crystalline silicon film 74. The low-resistance poly-crystalline silicon film 73 has the same structure as the gate electrode of the MISFET provided on the same substrate surface. Accordingly, a thickness of the low-resistance poly-crystalline silicon film 73 is generally 2000 to 4000 Å, an impurity concentration is more than $10^{20}$ atoms/cm$^3$ and a sheet resistance is less than 100 Ω/□. The impurity concentration of the high-resistance poly-crystalline silicon film 74 is selected to be $10^{15}$ to $5 \times 10^{19}$ atoms/cm$^3$ in order to obtain a stable value as a resistor element. The optimum value is $10^{17}$ to $5 \times 10^{19}$ atoms/cm$^3$. The high-resistance poly-crystalline silicon film 74 is formed to have a thickness between 100 to 1000 Å. The optimum value as a thickness which allows to readily control the impurity concentration by ion implantation is 500±100 Å. In order to be high-resistance, the grain size of the high-resistance poly-crystalline silicon film 74 is formed to be smaller than that of the low-resistance poly-crystalline silicon film 73. The grain size may be controlled by forming conditions of the poly-crystalline silicon film.

In the present invention, because the poly-crystalline silicon films in the low and high-resistance sections are formed separately, they may be controlled to have the optimum value, respectively. An intermediate insulating film 75 is formed on the poly-crystalline silicon film. Contract holes are created through the intermediate insulating film on the low-resistance poly-crystalline silicon films and through the contact holes, metal electrodes 76 are electrically connected with the respective low-resistance poly-crystalline silicon films. Generally, the metal electrode 76 is formed out of an aluminum wire. A passivation film 77 which is a silicon nitride film is provided on the metal electrodes 76.

The resistor elements as shown in FIG. 9 are connected in series through the aluminum wires, thus forming the ladder resistor circuit. Because a resistance ratio of the high-resistance section and the low-resistance section near the electrode can be increased to more than 5 times of the past, the resistance ratio of the ladder resistor may be accurately set.

FIGS. 11a through 11e show section views showing a manufacturing method of the resistor element as shown in FIG. 9 in the order of the process.

At first, the poly-crystalline silicon film 73 having about 2000 to 4000 Å is formed on the surface of the substrate 41 via the field insulating film 42. Phosphorus which is an impurity element is doped by more than $10^{20}$ atoms/cm$^3$ by means of ion implantation or impurity diffusion furnace.

Figure 11A:
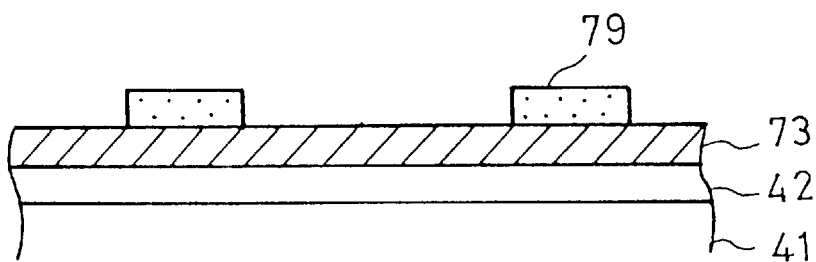
FIGS. 11A through 11E are section views showing steps of the method for manufacturing the resistor element of the semiconductor device of the present invention.

Next, in order to pattern the poly-crystalline silicon film as shown in FIG. 11a, resist films 79 are patterned by a normal photolithographic technology. The poly-crystalline silicon film 73 is selectively etched by using the resist films 79 as a mask to form a poly-crystalline silicon film area.

Figure 11B:
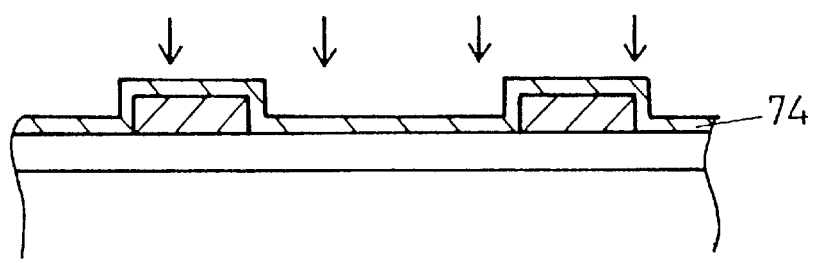

Then, the high-resistance poly-crystalline silicon film 74 having about 500 Å of thickness is formed on the whole surface of the substrate 41 as shown in FIG. 11B. While the thick poly-crystalline silicon film 73 is formed normally by LPCVD, the thin poly-crystalline silicon film 74 is formed by LPCVD or sputtering. The sputtering allows to control the thickness and to remove a natural oxide film on the thick poly-crystalline silicon film 73 caused by inverse sputtering.

Accordingly, the thin poly-crystalline silicon film 74 may be formed continuously on the thick poly-crystalline silicon film 73. In order to regulate the resistance value of the thin poly-crystalline silicon film 74, arsenic or phosphorus element is ion-implanted on the whole surface. After the ion implantation, a heat treatment is implemented so that the impurity element distributes on the thin poly-crystalline silicon film 74. Due to this heat treatment, the thin poly-crystalline silicon film 74 on the thick poly-crystalline silicon film 73 also becomes a high-concentrate impurity area, allowing an ohmic contact with a metal film in the latter process. A condition of thermal diffusion is set so that a distance between which the impurity element in the thick poly-crystalline silicon film 73 diffuses to the thin poly-crystalline silicon film 74 is at least more than 500 Å which is the thickness of the thin poly-crystalline silicon film 74. It is not preferable to prolong the thermal diffusion because a resistor length of the low-resistance section becomes large. Accordingly, it is preferable to be set at the diffusion condition between the thin poly-crystalline silicon film 74 and within 1 $\mu$m.

Figure 11C:
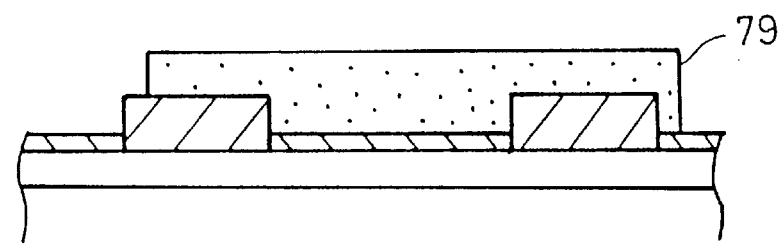
Figure 11D:
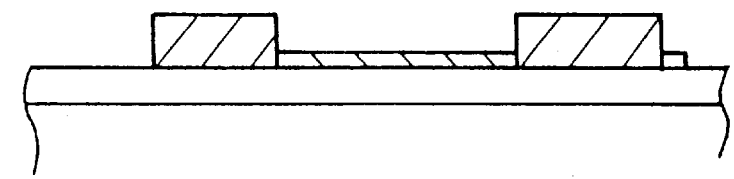

Next, a resist film 79 for a final patterning of the poly-crystalline silicon film is patterned by normal photolithography as shown in FIG. 11C. Then, the thick part and thin poly-crystalline silicon film part are etched simultaneously using the resist film 79 as a mask as shown in FIG. 11D. Because the area where the thickness is thick is highly concentrated, it may be etched in about the same time with the thin part. When their etching finishing times differ considerably, an etching gas which has a large selective ratio from a base oxide film and which will not advance etching in the horizontal direction is selected. For example, $CL_2$ gas is preferred in terms of the selective ratio and anisotropic etching.

Figure 11E:
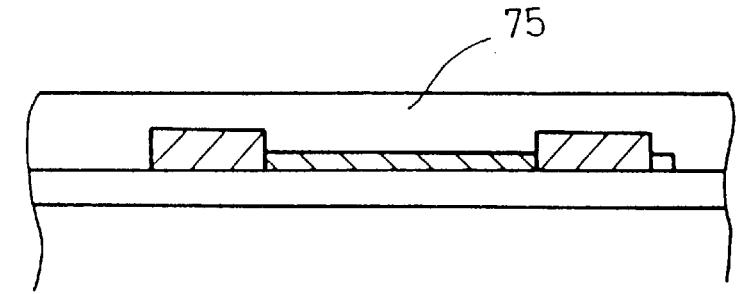

Then, the intermediate insulating film 75 is formed on the whole surface as shown in FIG. 11e.

Next, contact holes are perforated through the intermediate insulating film on the thick poly-crystalline silicon film by a normal method, though it is not shown. Then, an aluminum film is formed on the whole surface and the metal wires are patterned so that the aluminum film is left in the contact hole by a normal photolithography in the same manner. Finally, the passivation film is formed on the metal wires.

As described above, the high-resistance element may be formed by adding one photolithographic process. Further, the ladder resistor circuit may be formed accurately in a small area by constructing the resistor element by two kinds of poly-crystalline silicon films. Thus, the manufacturing process of the present invention is as simple as the prior art process. When the MISFET is formed on the same substrate, its gate electrode is patterned by the process of FIG. 11c. It may be fabricated by forming source and drain areas after that.

Figure 12A:
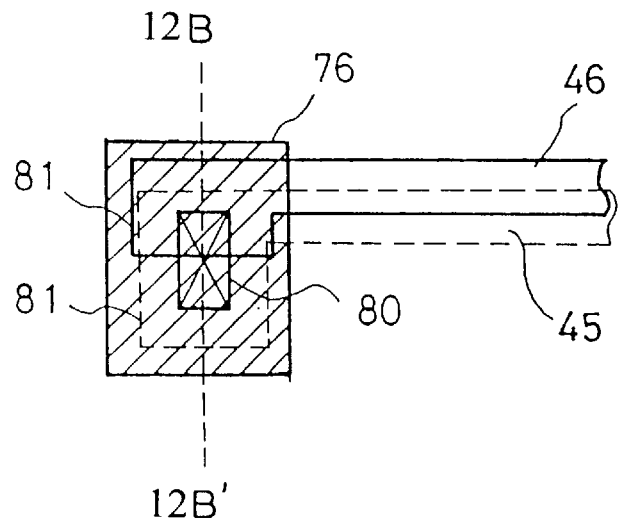
FIGS. 12A and 12B are a plan view and a section view of a part where resistors of the ladder resistor circuit of the present invention contact from each other.
Figure 12B:
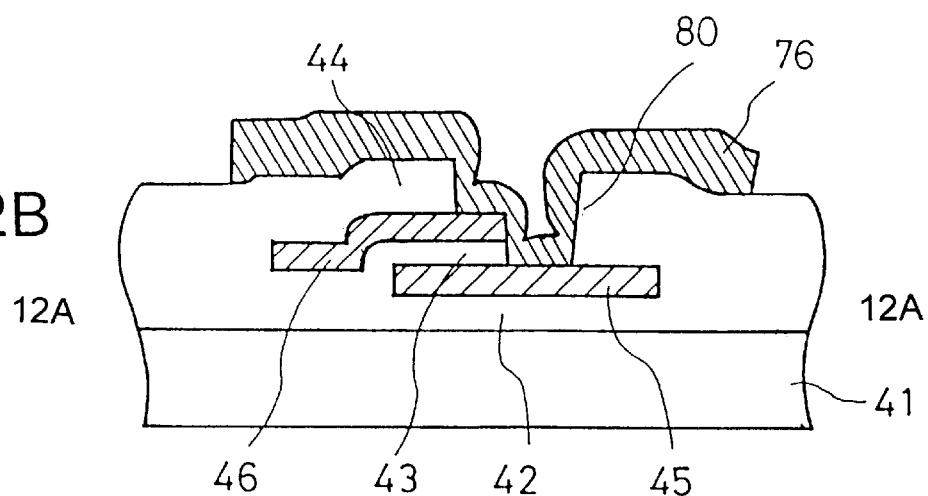

FIGS. 12a and 12b show plan and section views of a contact part for electrically connecting the first and second-layer poly-crystalline silicon films of the ladder resistor circuit described above. The resistor 45 for which the first-layer poly-crystalline silicon film is used is electrically connected with the resistor 46 for which the second-layer poly-crystalline silicon is used via the metal electrode 76 formed on the contact hole 80. The resistors 454 and 46 are overlapped at the ends thereof on opposing sides of the interlayer insulating film 43 and only one contact hole 80 is formed above the overlapped part of the end 81 of respective poly-crystalline silicons.

Figure 13A:
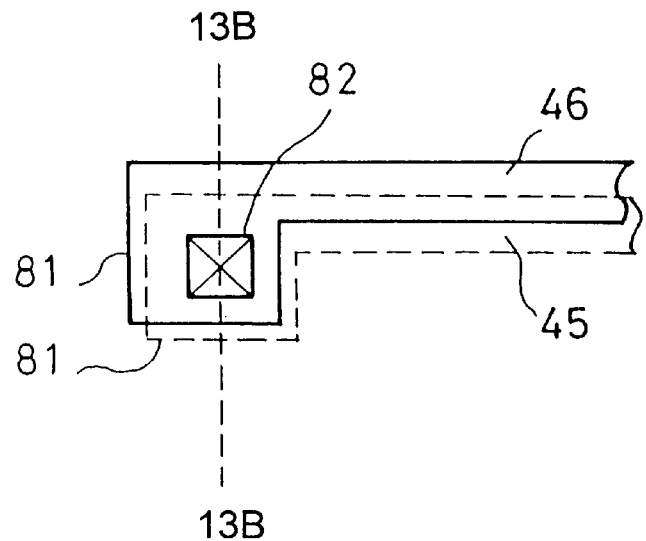
FIGS. 13A and 13B are a plan view and a section view of a part where resistors of the ladder resistor circuit of another embodiment of the present invention contact from each other.
Figure 13B:
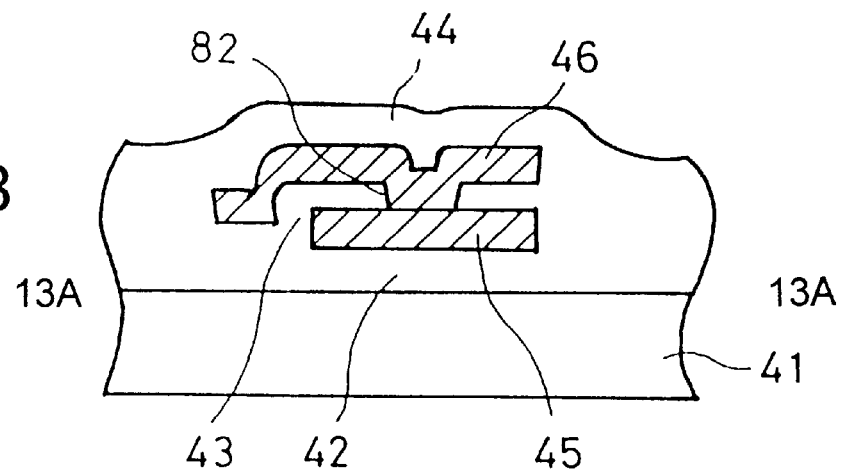

Alternatively, the first and second-layer poly-crystalline silicons may be contacted by a method shown in FIG. 13. That is, in FIG. 13, a via hole 82 is created through the interlayer insulating film 43 between the first and second poly-crystalline silicons to directly connect the first and second poly-crystalline silicons.

Figure 14:
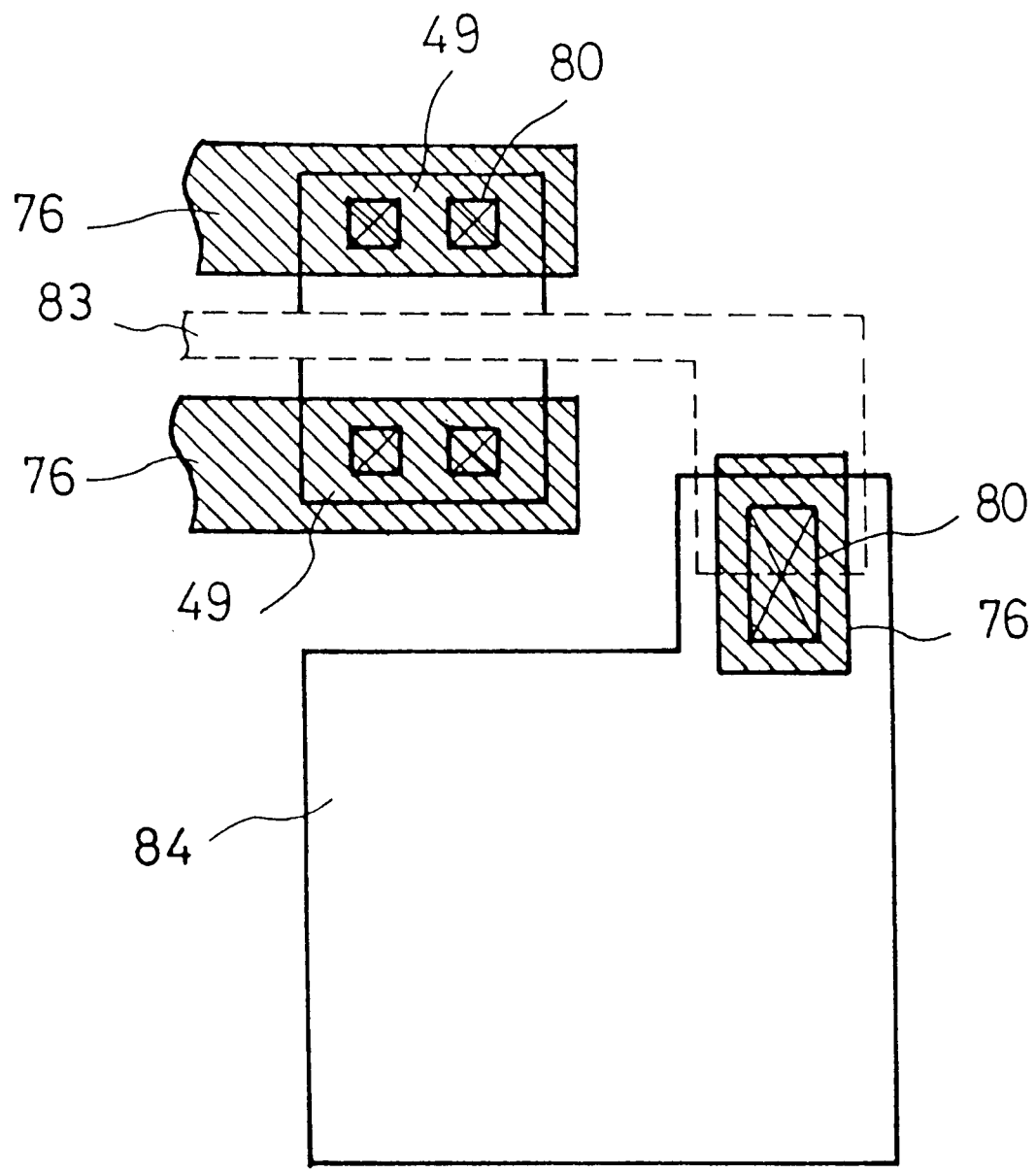
FIG. 14 is a plan view of a part where a gate electrode and a capacitor electrode of an insulated gate field effect transistor of the present invention.

These contact methods are not limited only for the connection part of the resistors of the ladder resistor circuit or the like. For example, they may be applied to an electrical connection of a gate electrode of a MISFET and a capacitor electrode 84 as shown in FIG. 14. That is, this contact method may be applied to all parts where the first and second-layer poly-crystalline silicons are electrically connected.

Figure 15A:
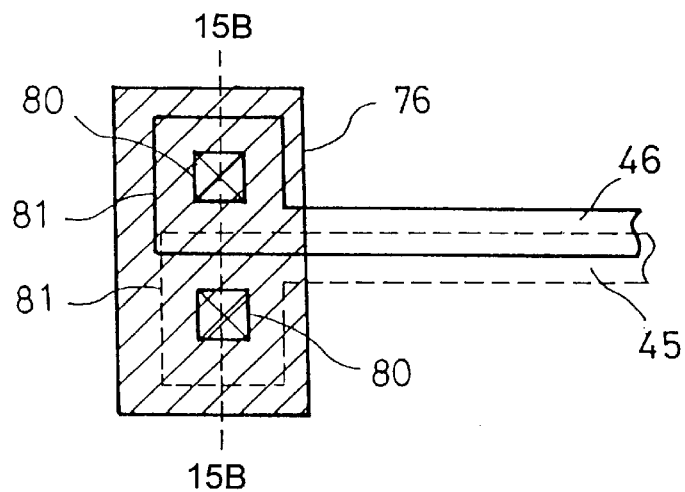
FIGS. 15A and 15B are a plan view and a substrate section view of another embodiment of the part where resistors of the ladder resistor circuit contact from each other.
Figure 15B:
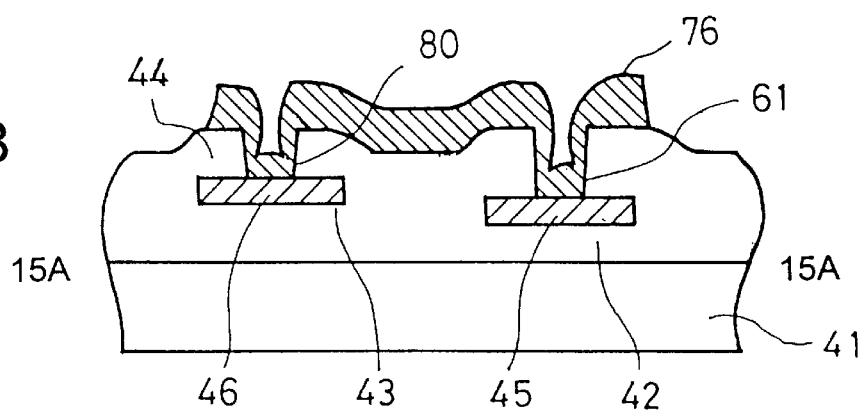

By the way, a configuration as shown in FIG. 15 is known as a method for connecting the first and second poly-crystalline silicons in the ladder resistor circuit in which two layers of poly-crystalline silicons are used for the resistors. That is, one contact hole 80 is provided at each end 81 of the first and second poly-crystalline silicons forming the resistors and those two contact holes are connected by a metal electrode 76. At this time, the end of the poly-crystalline silicon has to have a larger area than the contact hole taking a disalignment into account. That is, the end of the poly-crystalline silicon takes a certain distance from the end of the contact hole considering the disalignment or the like as a margin. Accordingly, an area necessary for contacting those two poly-crystalline silicons requires at least two ends of the poly-crystalline silicon.

However, those two contact methods described previously in connection with FIGS. 12 and 13 allow to cut a part of the area of margin for contacting the ends of those two poly-crystalline silicons provided in consideration of the disalignment for the area necessary for the contact hole. Due to that, when a number of such contact sections exist in one circuit, a degree of reduction of chip area becomes significant that much as compared to the latter method.

As a method for connecting the first poly-crystalline silicon and the second poly-crystalline silicon, another example of the method of directly connecting them as described before will be explained below with reference to the drawings.

Figure 16:
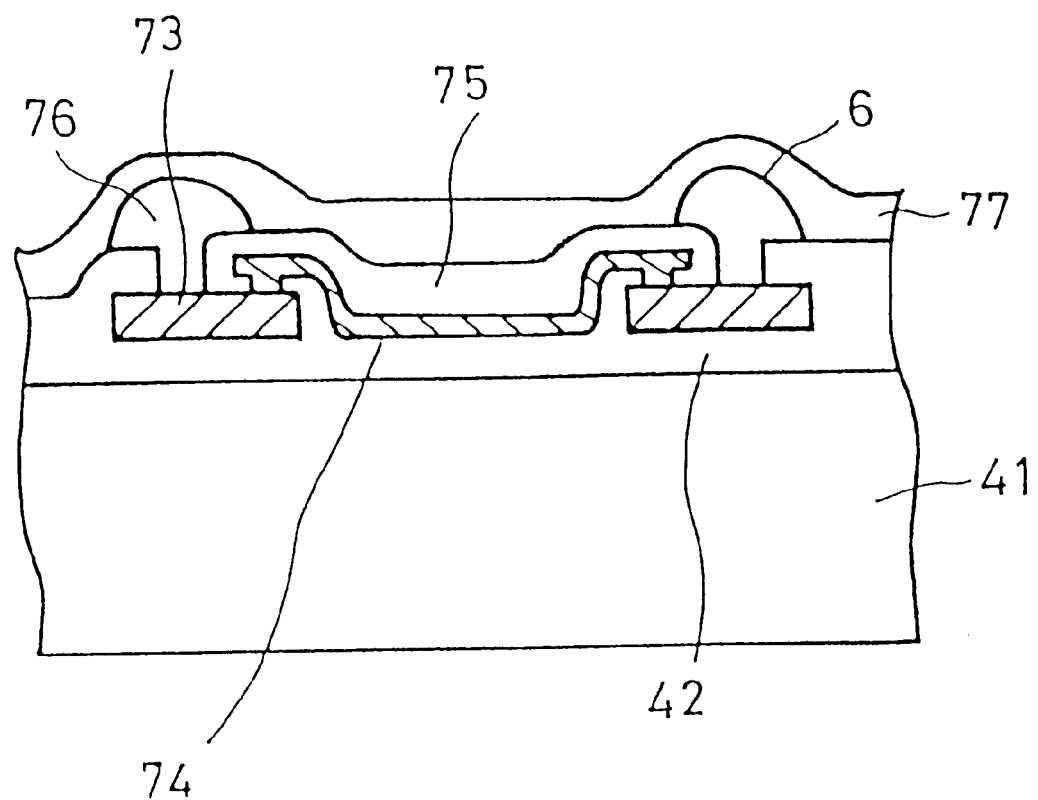
FIG. 16 is a section view of another embodiment of the resistor element of the semiconductor device of the present invention.

FIG. 16 is a section view of a resistor element composing the semiconductor device of the present invention. A field insulating film 42 is provided on a surface of a substrate 41 and a high-resistance poly-crystalline silicon film 74 whose thickness and impurity concentration are thin is provided on the field insulating film 42. Thick low-resistance poly-crystalline silicon films 73 are provided on the both sides of the high-resistance poly-crystalline silicon film 74. The low-resistance poly-crystalline silicon film 73 has the same structure with the gate electrode of the MISFET provided on the same substrate surface. Accordingly, a thickness of the low-resistance poly-crystalline silicon film 73 is generally 2000 to 4000 Å, an impurity concentration is more than $10^{20}$ atoms/$cm^3$ and a sheet resistance is less than 100 $\Omega/\square$. The impurity concentration of the high-resistance poly-crystalline silicon film 74 is selected to be $10^{15}$ to $5 \times 10^{19}$ atoms/$cm^3$ in order to obtain a stable value as a resistor element. The optimum value is $10^{17}$ to $5 \times 10^{19}$ atoms/$cm^3$. The high-resistance poly-crystalline silicon film 74 is formed to have a thickness between 100 to 1000 Å. The optimum value as a thickness which allows one to readily control the impurity concentration by ion implantation is 500±100 Å. In order to provide a high-resistance, the grain size of the high-resistance poly-crystalline silicon film 74 is formed to be smaller than that of the low-resistance poly-crystalline silicon film 73. The grain size may be controlled by forming conditions of the poly-crystalline silicon film. In the present invention, because the poly-crystalline silicon films in the low and high-resistance sections are formed separately, they may be controlled to have the optimum value, respectively.

An intermediate insulating film 75 is formed on the poly-crystalline silicon film. Contact holes are created through the intermediate insulating film formed on the low-resistance poly-crystalline silicon films and through the contact holes, metal electrodes 76 are electrically connected with the respective low-resistance poly-crystalline silicon films. Generally, the metal electrode 76 is formed out of an aluminum wire. A passivation film 77 which is preferably a silicon nitride film is provided on the metal electrodes 76.

The resistor elements as shown in FIG. 16 are connected in series through the aluminum wires, thus forming the ladder resistor circuit. Because a resistance ratio of the high-resistance section and the low-resistance section near the electrode can be increased to more than 5 times of the prior art, the resistance ratio of the ladder resistor may be accurately set.

The thick low-resistance poly-crystalline silicon film is electrically connected with the thin high-resistance poly-crystalline silicon film via the contact holes provided on the thick low-resistance poly-crystalline silicon film. Although the case when the poly-crystalline silicon film is used as the low-resistance film has been explained in connection with FIG. 16, various low-resistance films such as a metal film, high-fusion point metal film, a silicide film or polycide film may be used as the low-resistance film because the low-resistance film and the high-resistance poly-crystalline silicon film are connected via the contact holes as shown in FIG. 16 in the present invention. The low-resistance film may serve readily as the gate electrode of the MISFET provided on the same substrate. In particular, because the low-resistance film may be formed to have a resistance lower than the poly-crystalline silicon film, a resistance ratio between the high-resistance section and the low-resistance section may be larger. Accordingly, when a ladder circuit is formed, a resistance ratio at each connection point of the ladder circuit may be accurately set.

Figure 17:
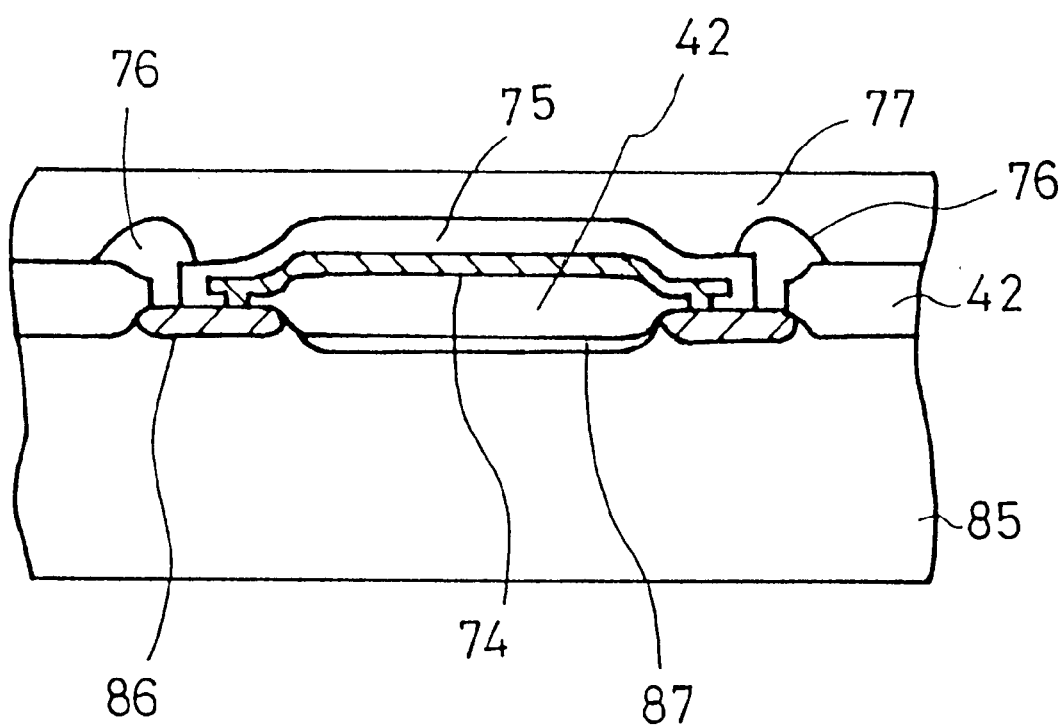
FIG. 17 is a semiconductor device of another embodiment of the resistor element of the semiconductor device of the present invention.

FIG. 17 is a section view of an embodiment when a low-resistance impurity area is formed in stead of the low-resistance film. For example, N+ type low-resistance impurity areas 86 separated from each other are provided on the surface of a P type silicon substrate 85. A thin high-resistance poly-crystalline silicon film which is a substantial resistor is provided on a field insulating film 42. The thin high-resistance poly-crystalline silicon film 74 is electrically connected via contact holes provided on the N+ type low-resistance impurity areas 86. Metal electrodes 76 are provided also on the N+ type low-resistance impurity areas 86 via other contact holes created through an intermediate insulating film 75. A field doped area (an inversion preventing area into which high-concentrate impurity is doped from the substrate 85) 87 is provided on the surface of the substrate 85 under the field insulating film 42 under the high-resistance poly-crystalline silicon film 74. The formation of the field doped area 87 allows the high-resistance poly-crystalline silicon film 74 to be shielded by a potential of the substrate 85 and to obtain a stable resistance characteristic.

The configuration shown in FIG. 17 allows the N+ type low-resistance impurity areas 86 to be formed to serve also as a source/drain area of the MISFET provided on the same substrate.

The ladder resistor circuit and poly-crystalline silicon resistor forming it described above may be used for various semiconductor devices.

Figure 18:
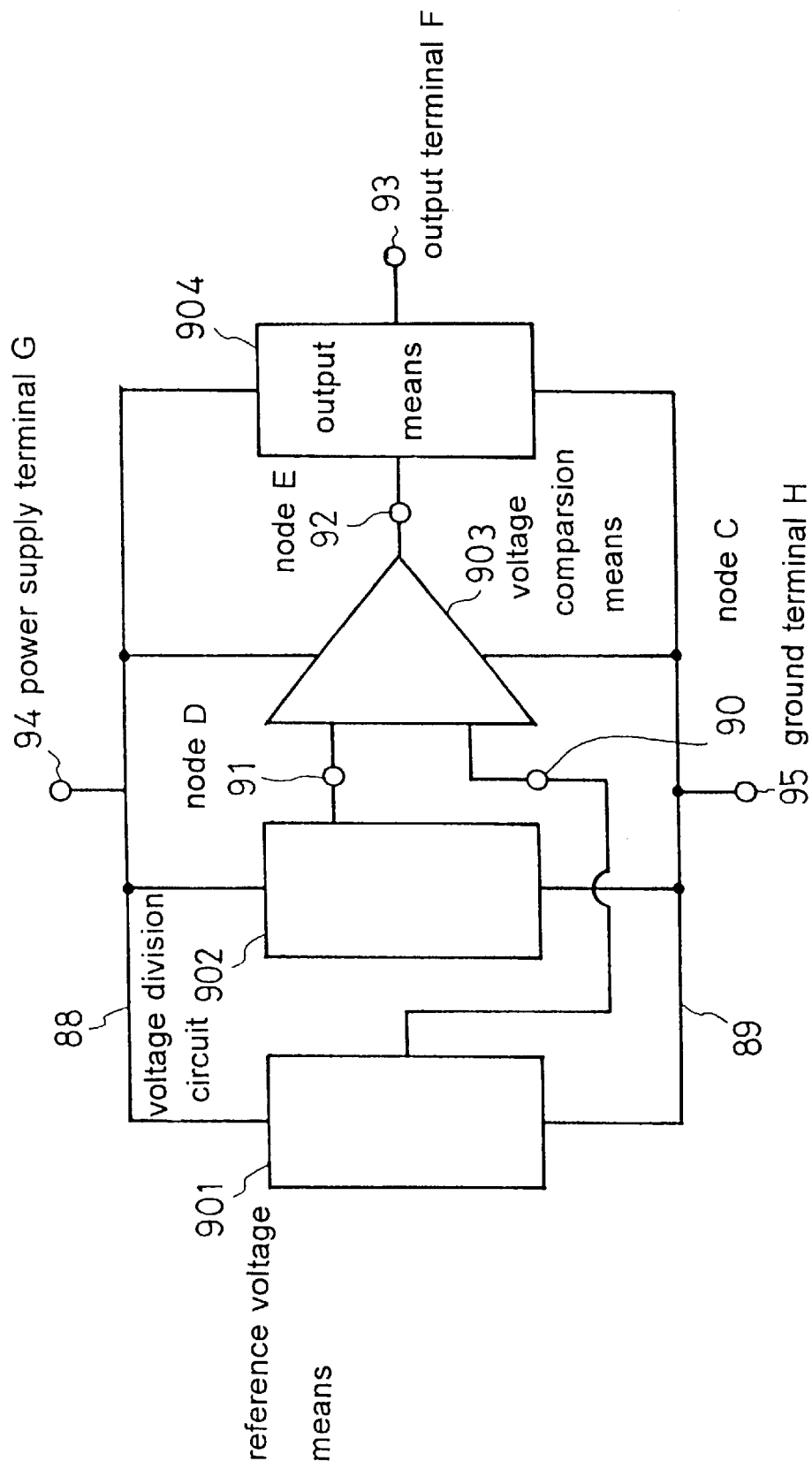
FIG. 18 is a circuit block diagram of a voltage detector of the present invention.

As an example, a circuit block diagram of a voltage detector which is one of the semiconductor devices used in a power source is shown in FIG. 18. The voltage detector comprises reference voltage means 901, voltage dividing means 902, voltage comparison means 903 and output means 904.

The reference voltage means 901 is connected between a power line 88 and a ground line 89 and has a function of outputting a constant voltage to a contact point C 90.

The voltage dividing means 902 comprises a plurality of serial resistors connected between the power line 88 and the ground line 89 and has a function of dividing a power voltage by setting a contact point D 91 as a starting point.

The voltage comparison means 903 is connected between the power line 88 and the ground line 89, receives the output of the reference voltage means 901 at the contact point C 90 and the output of the voltage dividing means 902 at the contact point D 91, and has a function of inputting a difference of voltages at the contact point C 90 and the contact point D 91 and outputting a constant voltage to a contact point E 92 when the voltage at the contact point D 91 is lower than that at the contact point C 90.

The output means 904 is connected between the power line 88 and the ground line 89 and has a function of receiving the output of the voltage comparison means 903 at a contact point E 92 to output a power voltage to an output terminal F 93.

The voltage detector has a function of setting an output voltage to 0 V when the power voltage becomes less than a detected voltage (e.g. less than 0.8 V).

The detected voltage is determined by a reference voltage which is the output voltage of the reference voltage means 901 and a ratio of high-resistance poly-crystalline silicon resistors composing the voltage dividing means 902. It is devised so that a desired voltage may be obtained by a poly-crystalline silicon fuse.

Figure 19:
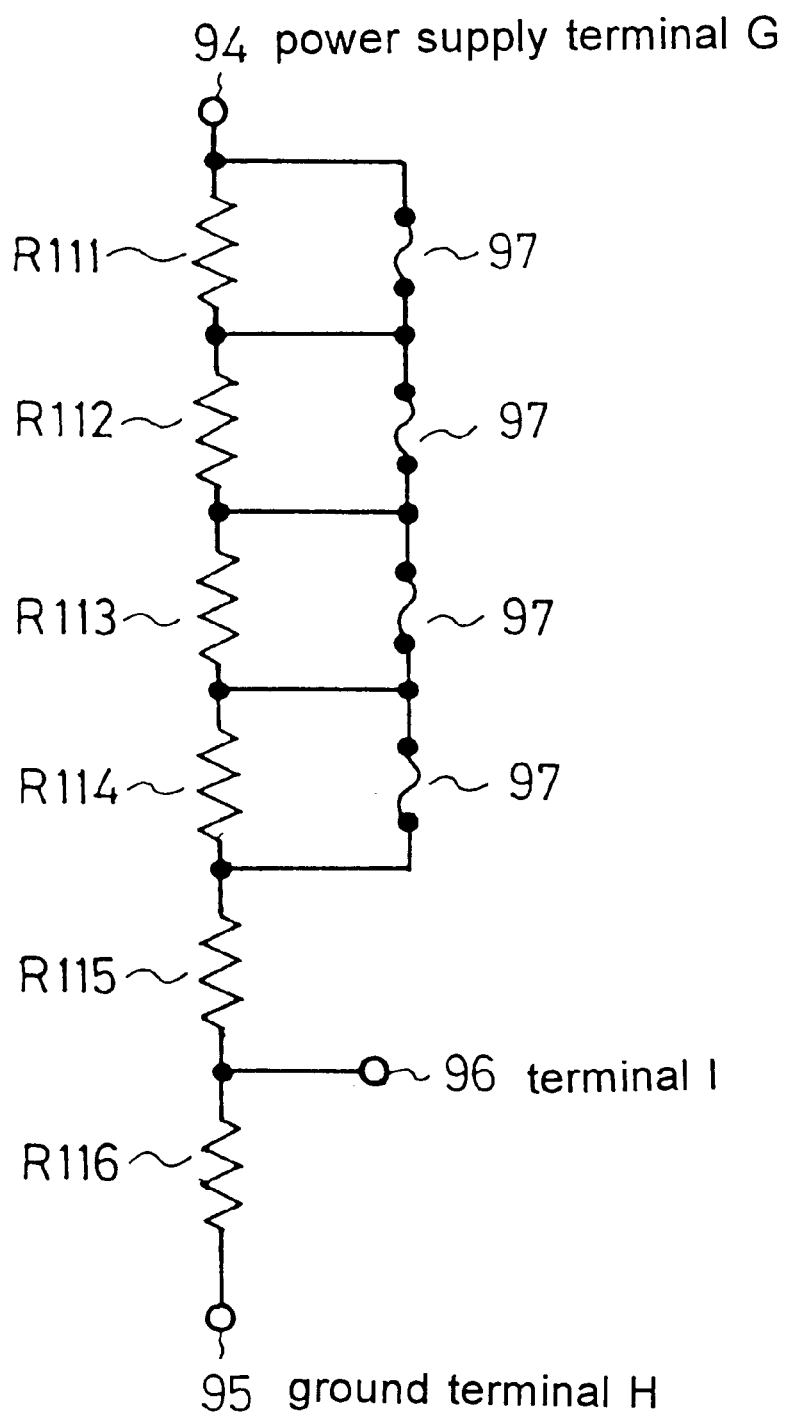
FIG. 19 is a circuit diagram of a ladder resistor circuit adopted for a circuit dividing circuit within the voltage detector of the present invention.

FIG. 19 shows one example of the voltage dividing means. As a method for dividing voltage, a ladder resistor circuit in which more than two resistors are combined to divide a power voltage by its resistance ratio is adopted. The ladder resistor circuit is constructed by a resistor circuit comprising poly-crystalline silicon resistors $R_{111}$ through $R_{116}$ having a high resistance of more than 1 k $\Omega/\square$ and poly-crystalline silicon fuses 97 having a low resistance of less than 100 $\Omega/\square$ and has a function of dividing a voltage applied to a power terminal G94 and a ground terminal H95 by a resistance ratio of the poly-crystalline silicon resistors and outputting a divided voltage. The ladder resistor circuit used here contains a plurality of circuits, comprising one poly-crystalline silicon resistor and one poly-crystalline silicon fuse connected in parallel as one unit, connected in series. A resistance value related to the partial voltage of the ladder resistor circuit may be changed and a desired partial voltage may be obtained from a terminal I 96 by cutting the poly-crystalline silicon fuse.

The resistance dividing ratio of the ladder resistor circuit for obtaining a partial voltage determines a detected voltage of the voltage detector. Due to that, performances of the voltage detector such as a detected voltage range, detection accuracy or the like are determined by the designed pattern and accuracy of the ladder resistor circuit. For example, when the detected voltage range is to be widened, an area of the ladder resistor circuit is increased because the resistance value has to be large. Further, when the resistance value disperses more, the detection accuracy is worsened.

Figure 20:
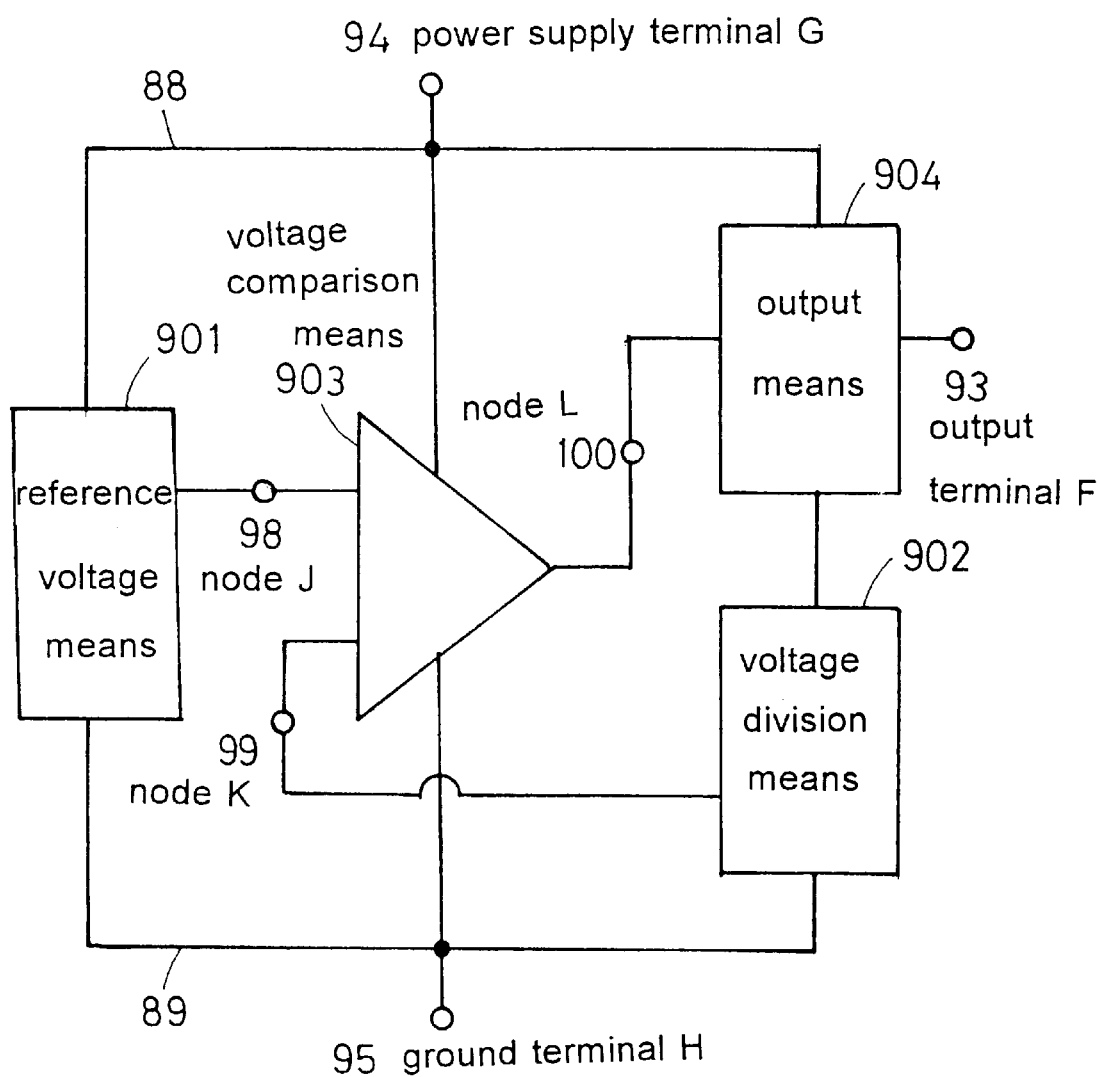
FIG. 20 is a circuit block diagram of a voltage regulator of the present invention.

As another example, a circuit block diagram of a voltage regulator which is one of a semiconductor device for power supply is shown in FIG. 20.

The voltage regulator has a function of outputting a constant voltage always even when a voltage of a power terminal G 94 fluctuates or a load connected to an output terminal F 93 fluctuates. A voltage applied to the output terminal 93 is divided by voltage dividing means 902 and is output to a contact point K 99. This voltage is compared with a reference voltage output from reference voltage means 901 to a contact point J 98 by voltage comparison means 903. A voltage output from the voltage comparison means 903 to a contact point L 100 controls a gate voltage of a MISFET within output means 904 to keep the voltage of the output terminal F 93 constant. In this case, a ladder resistor circuit is used for the voltage dividing means 902. A resistance dividing ratio determines a value of the constant voltage output by the voltage regulator. That is, range and accuracy of the constant voltage are determined by the designed pattern and accuracy of the ladder resistor circuit. For example, when the selectable range of the constant voltage to be output is to be widened, an area of the ladder resistor circuit is increased because the resistance value has to be large. Further, when the resistance value disperses more, the accuracy of the output constant voltage is worsened.

The ladder resistor circuit used in the voltage detector and the voltage regulator described above is constructed as shown in FIG. 21 wherein minimum resistors R 201 having a fixed length and a fixed width are disposed in series and in parallel at regular intervals in a fixed direction to reduce a dispersion of etching shapes in an etching process for forming the resistors. A ladder resistor circuit having desired performances is fabricated by combining those minimum resistors. The length of the minimum resistor is a size of the minimum resistor R 201 in a direction of circuit path from the power terminal G 94 to the ground terminal H 95 and the width thereof is a size in a direction perpendicular to that.

Figure 21:
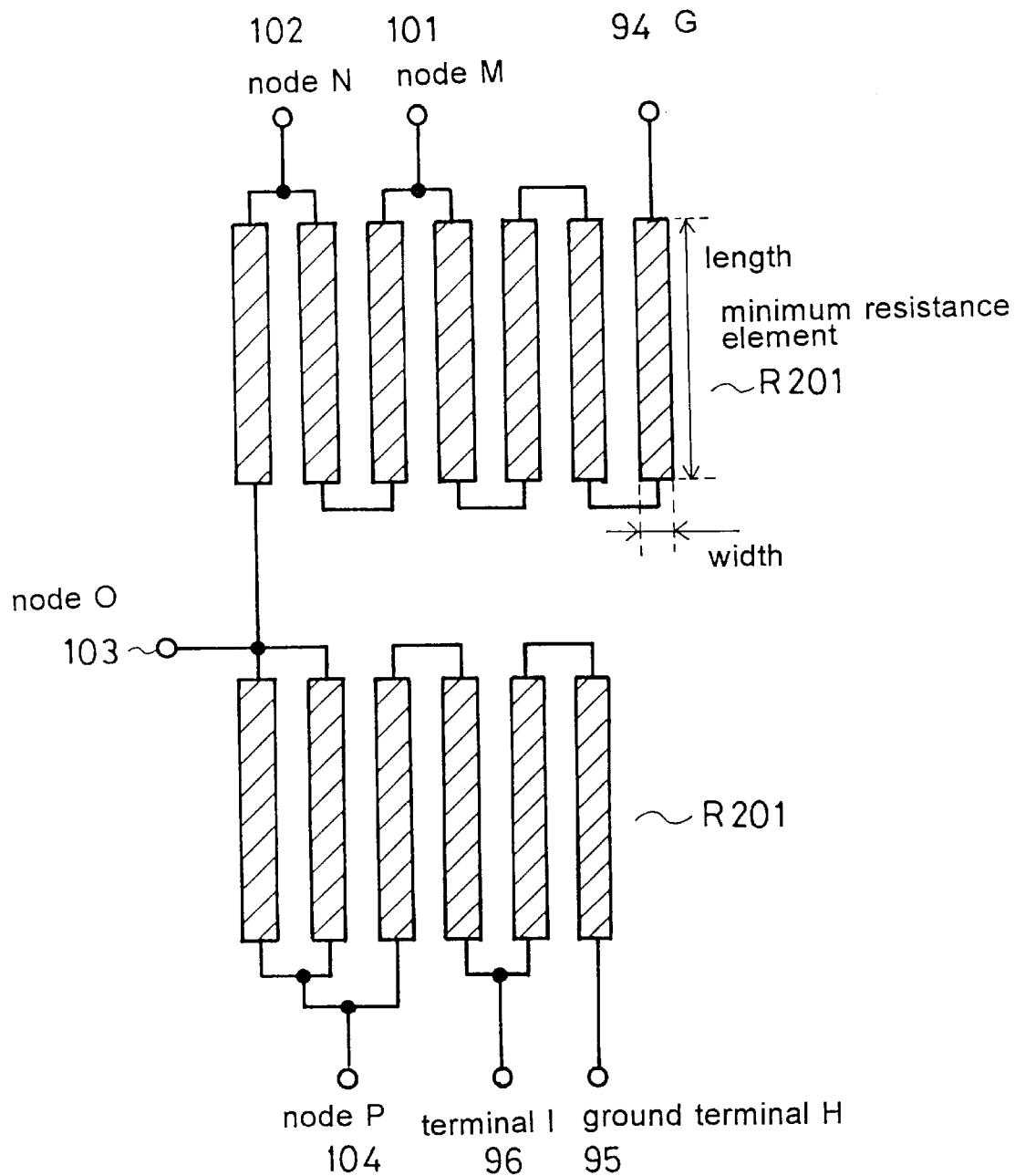
FIG. 21 is a diagrammatic view of a plane of a substrate of a ladder resistor circuit within the voltage detector of the present invention.
Figure 22:
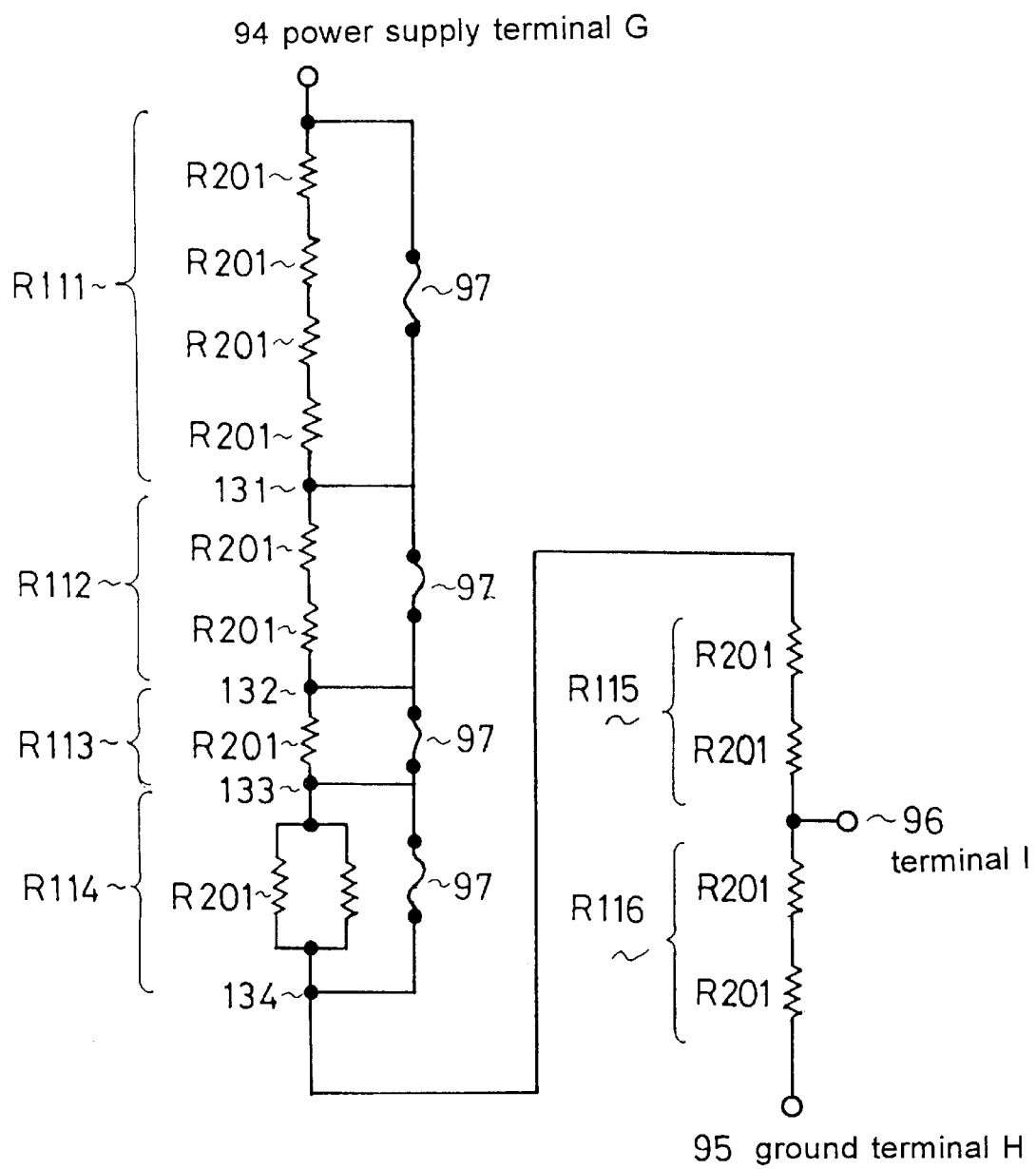
FIG. 22 is a circuit diagram of another embodiment of the ladder resistor circuit adopted for the voltage dividing means within the voltage detector of the present invention.

In this ladder resistor circuit, the voltage applied between the power terminal G 94 and the ground terminal 95 is divided by the resistors comprising the minimum resistors R201 and the partial voltage is output from the terminal I 96. Although not shown, the poly-crystalline silicon fuses are connected in parallel circuit-wise between the power terminal G 94 and a contact point M 101, the contact point M 101 and a contact point N 102, the contact point N 102 and a contact point O 103, and the contact point O 103 and a contact point P 104, respectively. The circuit diagram of FIG. 21 may be represented as shown in FIG. 22. Resistors R111 through R114 are all connected in parallel with the poly-crystalline silicon fuses 97, and the voltage dividing ratio of the voltage applied between the power terminal G 94 and the ground terminal H 95 may be changed and the voltage output from the terminal I 96 may be changed by cutting an arbitrary one of the poly-crystalline silicon fuses 97. The resistors R111 through R114 connected in parallel with the poly-crystalline silicon fuses 97 do not have the same resistance value. In FIG. 22, if a resistance value of the resistor R114 is R, a resistance value of R113 is 2×R, a resistance value of R112 is 4×R and a resistance value of R111 is 8×R. A wide range of resistance values from R to $2^{(n-1)}$ (where n is a maximum value of k) may be selected by setting the resistance value of the resistors connected in parallel with the poly-crystalline silicon in order from smaller one as $2^{(k-1)}$ (where k is 1, 2, . . . , i.e. a number of poly-crystalline silicon fuses), R being the minimum resistance value, as described above. In FIG. 21, a resistance value per R from R up to 15×R may be obtained by cutting the poly-crystalline silicon fuse. The resistor constructed so as to change in binary as such is very convenient in adopting the minimum resistors described above.

As described above, it is desirable to construct the poly-crystalline silicon resistor used in the ladder resistor circuit by the minimum resistors R 201 all having the same size as shown in FIG. 21 in order not to drop a voltage dividing accuracy of the ladder resistor circuit. In each unit in which the poly-crystalline silicon fuses and poly-crystalline silicon resistors are connected in parallel, the poly-crystalline silicon resistors are always constructed by the minimum resistors. However, poly-crystalline silicon resistors like R 115 and R 116 in FIG. 22 which are not provided with poly-crystalline silicon fuses may be structured by resistors which are longer than the minimum resistor, as necessary in terms of electrical characteristics of the ladder resistor circuit.

Thus, the high-resistance poly-crystalline silicon is an essential component in the semiconductor device for power supply and the ladder resistor circuit largely affects the cost and accuracy of the semiconductor device for power supply. Due to this, such a semiconductor device is substantially improved by the present invention.

In the semiconductor device including the ladder resistor circuit using the poly-crystalline silicon and the MISFET described above, it is necessary to shorten the whole length of the resistors made from the poly-crystalline silicon film composing the ladder resistor circuit and to increase a sheet resistance in order to reduce the area of the ladder resistor circuit without changing the electrical performance.

As described above, the poly-crystalline silicon resistors connected in parallel with the poly-crystalline silicon fuses are always composed of the plurality of minimum resistors connected in series or parallel. That is, when the width of the minimum resistor is fixed, the whole length of the poly-crystalline silicon resistor composing the ladder resistor circuit has to be shortened to reduce the area of the ladder resistor circuit, so that the length of each minimum resistor described above has to be shortened. Because the resistance value of the minimum resistor becomes small when the length of the minimum resistor is shortened, the sheet resistance has to be increased in the same time in order not to change the electrical performances.

Figure 23:
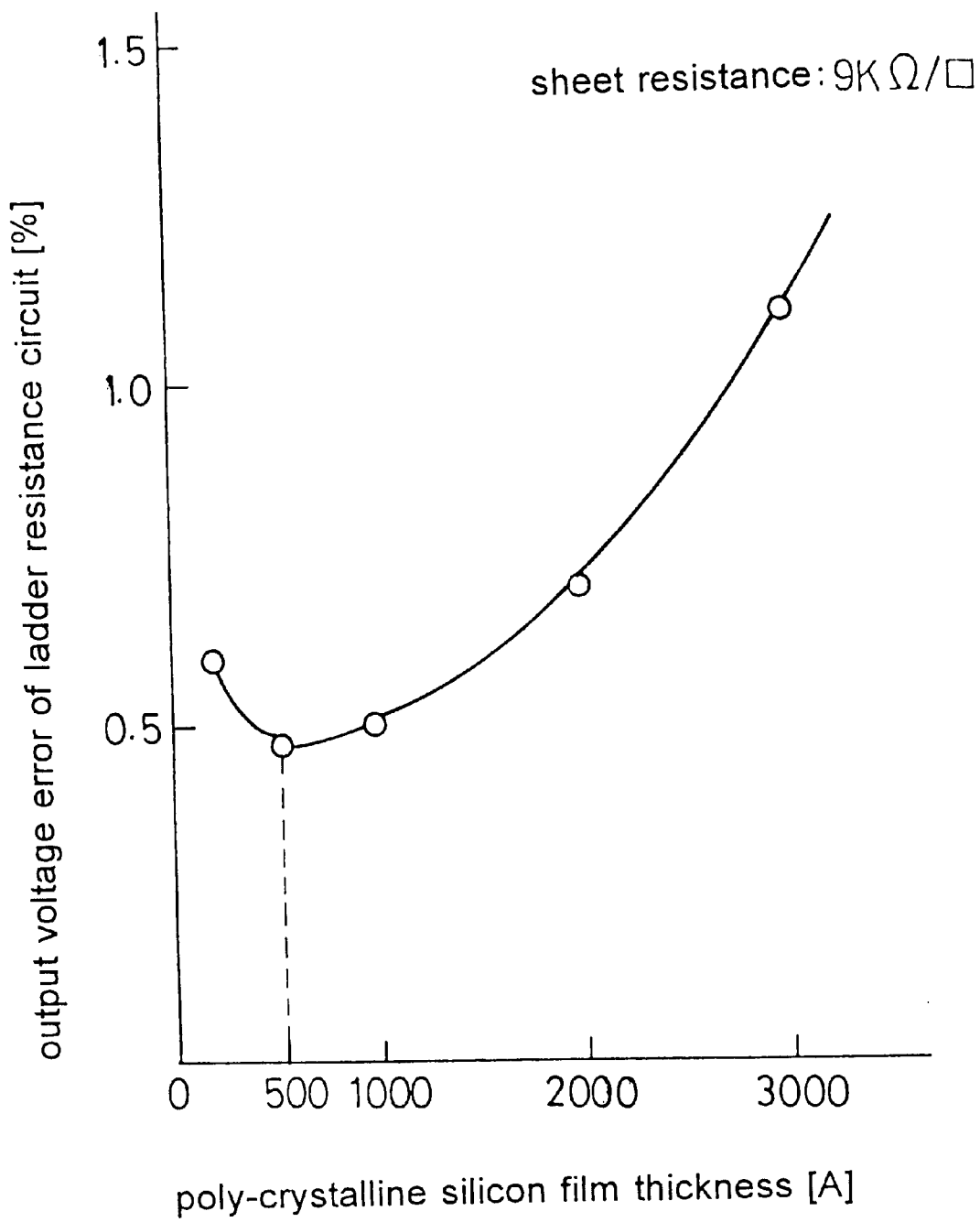
FIG. 23 is a graph showing a relationship between a thickness of a poly-crystalline silicon film and an error of output voltage of the ladder resistor circuit of the present invention.

When the impurity concentration implanted to the poly-crystalline silicon to form the ladder resistor circuit is lowered to increase the sheet resistance, the resistance value of the poly-crystalline silicon resistor disperses more due to the characteristics of the poly-crystalline silicon such that the implanted impurity is segregated at the grain boundary. The dispersion of the resistance value appears as a dispersion of output voltage detected from the terminal I 96 of the ladder resistor circuit in FIG. 22. The resistance value may be increased without increasing the dispersion of the resistance value by thinning the thickness of the poly-crystalline silicon. That is, the increase of the resistance may be realized corresponding to the reduction of the sectional area of the resistor without increasing the dispersion of the resistance value by reducing the thickness of the poly-crystalline silicon without changing the concentration of the impurity implanted to the poly-crystalline silicon. Further, if the resistance value is equal, the poly-crystalline silicon having a smaller thickness has a merit in that the dispersion of the resistance value becomes small as compared to the poly-crystalline silicon having a greater thickness because it is necessary to implant the high-concentrate impurity. FIG. 23 is a graph comparing output voltage errors caused by the dispersion of resistance values in each ladder resistor circuit having the same sheet resistance and different thicknesses. As is apparent from the figure, the ladder resistor circuit having thinner poly-crystalline silicon can reduce the output voltage error even though both are ladder resistor circuits having the same electrical characteristics. However, if the thickness is less than 500 Å, the output voltage error increases because dispersion of thickness within the substrate and between substrates increases. Due to this, the optimum value of the thickness is about 500 Å.

As described before, the dispersion of the resistance value may be reduced by thinning the poly-crystalline silicon resistors. Due to this, the reduction of the area of the ladder resistor circuit may be realized without changing its performances by shortening the length of the minimum resistors composing the ladder resistor circuit, increasing the sheet resistance at the same time and suppressing the increase of the dispersion of the resistance value caused by that by thinning the thickness of the poly-crystalline silicon.

The thickness of the poly-crystalline silicon, sheet resistance and the tendency of the reduction of the ladder resistor circuit in connection to those will be described below.

Figure 24:
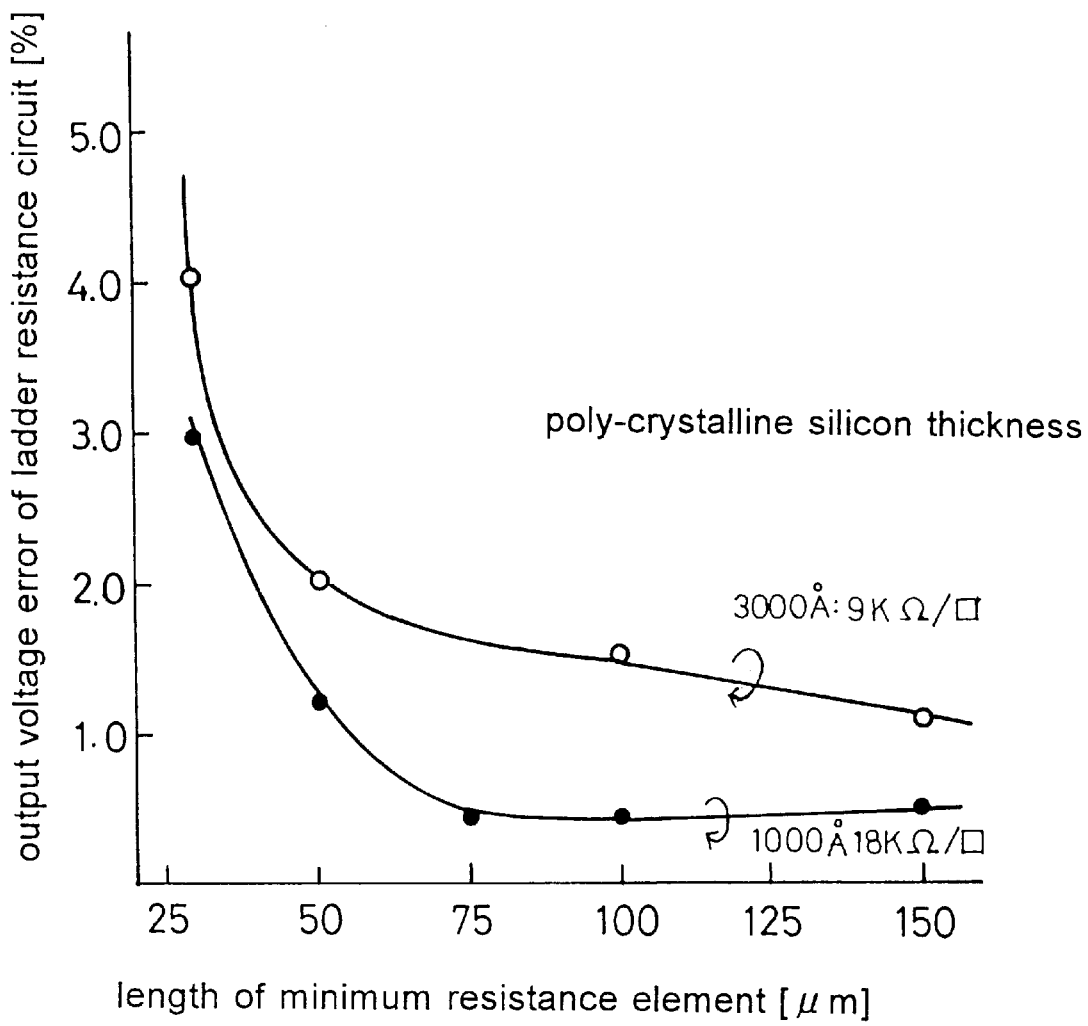
FIG. 24 is a graph showing a relationship between a length of a minimum resistor and an error of the output voltage of the ladder resistor circuit of the present invention.

As an example, the ladder resistor circuit used in the voltage detector or voltage regulator described before will be explained. FIG. 24 shows a state of output voltage errors of the ladder resistor circuit when the length of the minimum resistors composing the ladder resistor circuit is changed in each ladder resistor circuit having different sheet resistances and different thicknesses.

When the length of the minimum resistors composing the ladder resistor circuit is shortened, the dispersion of the resistance value of the minimum resistor generally made from a poly-crystalline silicon resistor increases by the reason described later and the output voltage error of the ladder resistor circuit increases. However, when the thickness of the poly-crystalline silicon is thinned, the dispersion of concentration of low-concentrate impurity is reduced as described before, so that the output voltage error of the ladder resistor circuit is reduced and the characteristic shifts in the lower direction.

It can be seen from FIG. 24 that when the thickness of the poly-crystalline silicon resistor is 3000 A, the sheet resistance is 9 k Ω/□ and the length of the minimum resistor is 150 μm as the prior art, a minimum resistor having more than about 60 μm of length will do to suppress the output voltage error to less than the prior art, i.e. less than 1% here, by reducing the thickness of the poly-crystalline silicon to 1000 Å. Because the sheet resistance of the poly-crystalline silicon whose thickness is 1000 Å is 18 k Ω/□, the area of the ladder resistor circuit may be reduce to a half when the length of the minimum resistor is 75 μm, while having the same electrical performance. That is, the length of the minimum resistor may be reduced to 60 to 100 μm by thinning the thickness of the poly-crystalline silicon resistor from 3000 A to 1000 A. Due to that, the area necessary for the ladder resistor circuit may be reduced and it can be reduced to less than a half by reducing the length of the minimum resistor to 60 to 75 μm for example.

Figure 25:
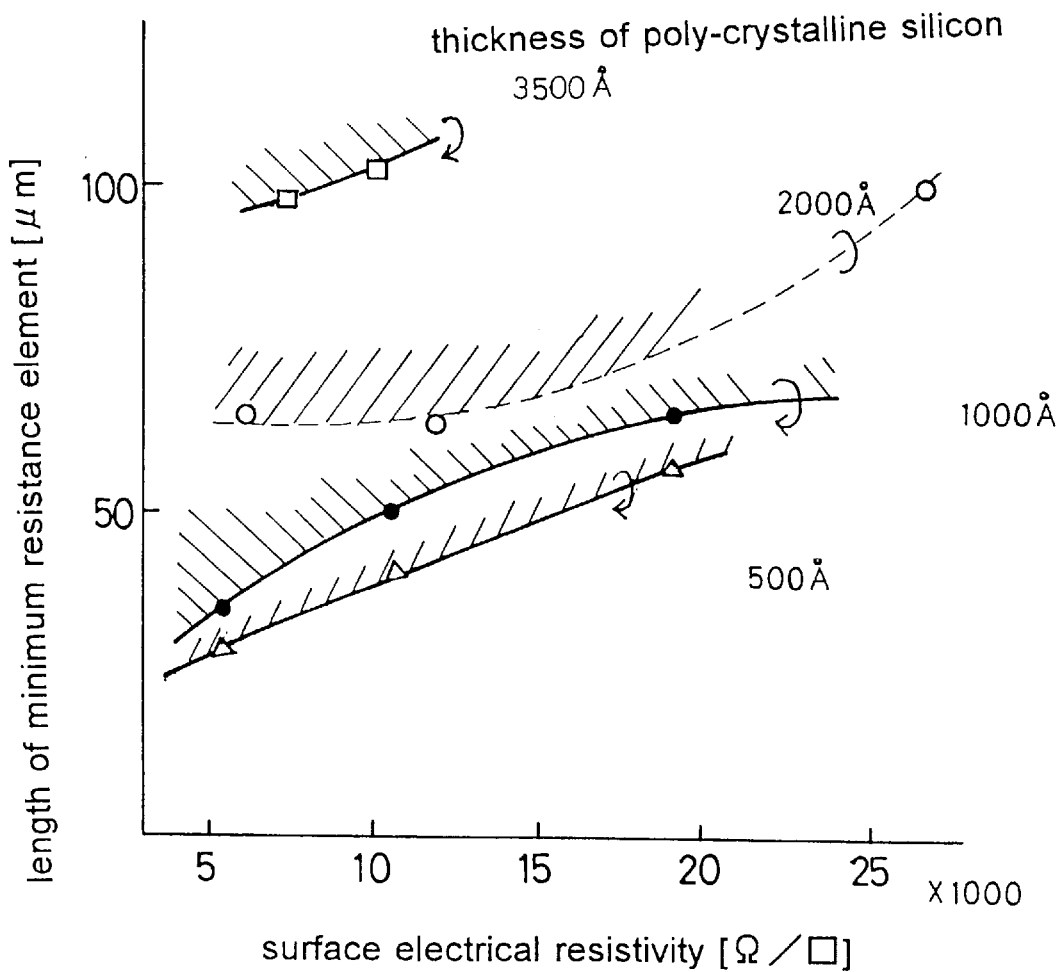
FIG. 25 is a graph showing a relationship between a length of the minimum resistor and a sheet resistance for keeping an error of output voltage of the ladder resistor circuit at less than a certain value according to the present invention.

As described so far, although the dispersion of resistance value of the poly-crystalline silicon increases when the resistance value is increased by lowering the impurity concentration or by shortening the length of the minimum resistor, the dispersion of the resistance value, i.e. the output voltage error of the ladder resistor circuit, may be reduced by thinning the thickness of the poly-crystalline silicon film. FIG. 25 shows a distribution of sheet resistances and lengths of the minimum resistor which allows to maintain less than 1% of output voltage error of the ladder resistor circuit with a parameter of the thickness of the poly-crystalline silicon film used in the ladder resistor circuit. In the figure, a slant line and an area above the slant line for each thickness of the poly-crystalline silicon represent the condition which permits to maintain less than 1% of dispersion. Because the further in the lower right direction in the figure, the shorter the length of the minimum resistor and the larger the sheet resistance become, a degree of reduction of the area of the ladder resistor circuit is great. FIG. 25 shows that the thinner the thickness, the higher resistance value as well as shorter minimum resistor length may be used. That is, it can be seen that the area necessary for the ladder resistor circuit may be reduced without altering the performance of the ladder resistor circuit by thinning the thickness of the poly-crystalline silicon film.

The poly-crystalline silicon film used for the gate of the MISFET needs to have about 2000 to 4000 Å of thickness. The thickness of the poly-crystalline silicon of the gate cannot be thinned because a phenomenon that impurities punch through the gate occurs in the process of implanting ions of the impurity to form the source/drain if it is thinned. Then, only the poly-crystalline silicon of the ladder resistor circuit may be thinned without thinning the gate of the MISFET and the area of the ladder resistor circuit may be reduced by forming the poly-crystalline silicon into the two-layer structure, using the first poly-crystalline silicon to form the gate of the MISFET and using the second poly-crystalline silicon to form the ladder resistor circuit as described before. Although a degree of the reduction of the ladder resistor circuit depends on the electrical specifications, it may be reduced to about ½ to ⅓ when the thickness of the poly-crystalline silicon is reduced from 3500 Å, which is the same with the gate, to 1000 Å. When the thickness is reduced to 500 Å, the area may be reduced to ⅓ to ¼.

While the thickness of the poly-crystalline silicon used for the ladder resistor circuit may be thinned to 100 to 1000 Å considering the dispersion of the thickness within the wafer and between wafers and the controllability of the thickness, it may be best set at 500 Å among them as described before. From FIG. 25, when the thickness of the poly-crystalline silicon resistor is 3500 Å, the length of the minimum resistor is 80 to 100 μm at minimum and when the sheet resistance is used up to 10 k Ω/□ at maximum, the minimum resistor whose length is 20 to 40 μm at minimum may be used with the same accuracy by the thinning. The sheet resistance may be stably used up to 25 to 40 k Ω/□ at maximum.

By the way, it needs to be careful when the concentration of impurity implanted to the poly-crystalline silicon is lowered to increase the sheet resistance because the dispersion of the resistance value may become large depending on an implanting condition. In case of ion implantation, an amount of impurity C to be implanted to the poly-crystalline silicon is determined by the following expression:

$$I \times t = C$$

where, I is an implanting current and t is an implanting time.

Figure 26:
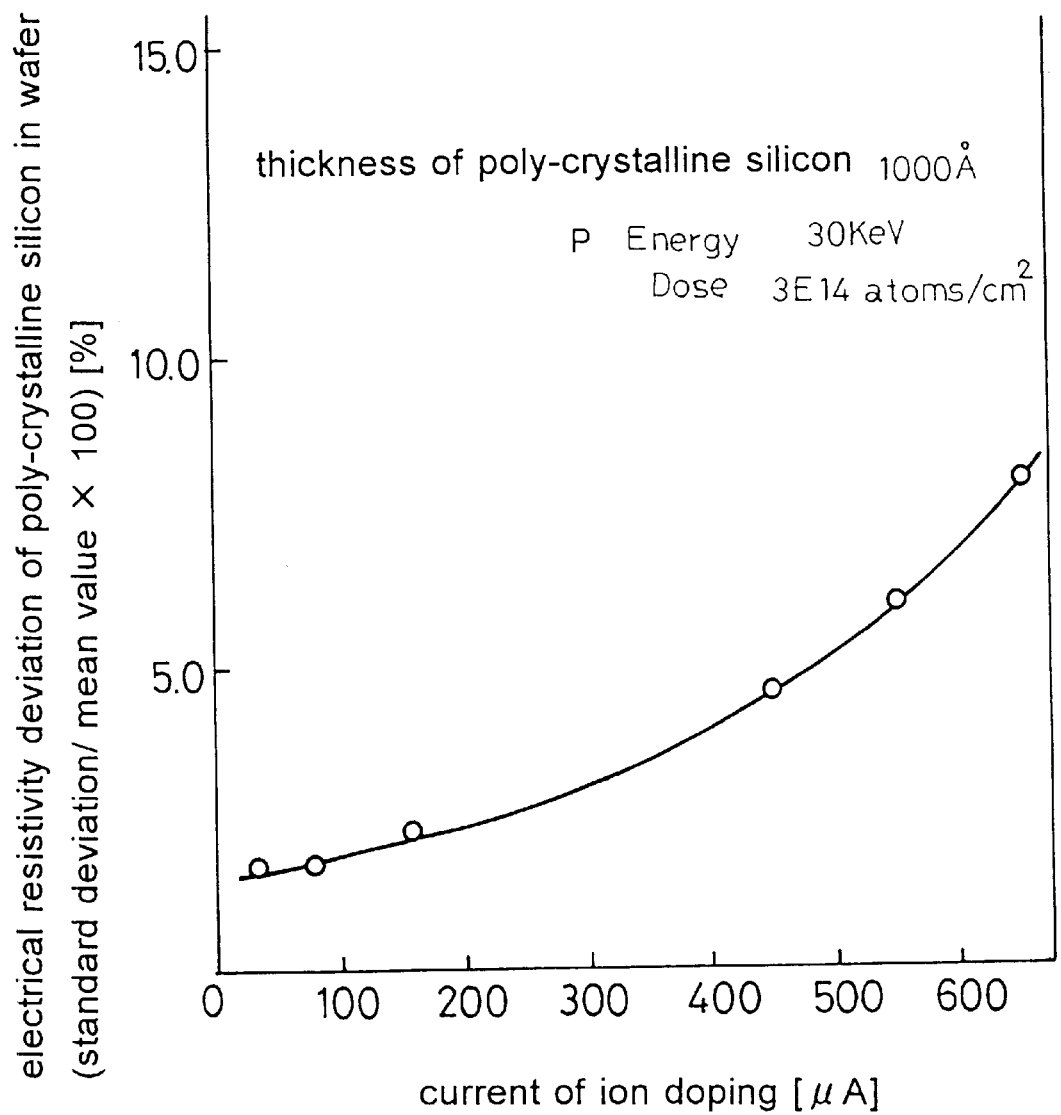
FIG. 26 is a graph representing an ion implanting current and a dispersion of a poly-crystalline silicon resistor substrate for forming a low-concentrate poly-crystalline silicon resistor of the present invention.

Thus, the amount of impurity C to be implanted may be reduced by reducing the implanting current I or by shortening the implanting time. Although it is advantageous to reduce the implanting current in the aspect of throughput because the implanting time is shortened, the dispersion of the resistance value becomes large. FIG. 26 shows a relationship between the implanting current and the dispersion of resistance value within the substrate surface when the same amount of impurity is implanted. The dispersion of the resistance value becomes large when the implanting current is large as shown in the figure because it becomes difficult for a device to output a large current stably in a short time when the implanting time is shortened and a dispersion of that current value appears as the dispersion of the resistance value. The implanting current to be used may be set between 60 and 500 µA from the aspects of the dispersion of resistance value, throughput and required electrical characteristics. When a resistance with less dispersion needs to be obtained for example, the implanting current is set around 60 to 150 µA. For one for which the throughput cannot be reduced, it is set around 300 to 500 µA while satisfying the electrical characteristics. Such proper use of the implanting current allows to accommodate with circuits having various specifications.

Further, as described before, the dispersion of the resistance value generally increases when the concentration of impurity to be implanted is lowered to increase the resistance value of the poly-crystalline silicon resistor. As another example for increasing the resistance value without lowering the impurity concentration, there is a method of implanting two types of impurities having different conductive types. While the concentration of the impurities to be implanted is a sum of the concentrations of the two types of impurities, this method has a merit that the impurity concentration which contributes to the electrical conductivity is determined by a difference of the concentrations of respective impurities to be implanted.

That is, a high resistance value may be obtained without lowering the impurity concentration. At this time, a desired resistance value may be obtained by changing the difference of the concentrations of the two types of impurities and the conductive type becomes equal to the conductive type of the impurity having the higher concentration.

For example, a resistance value equivalent to $1 \times 10^{19}$ atoms/cm$^3$ with N conductive type may be obtained by implanting $3 \times 10^{19}$ atoms/cm$^3$ of boron as a first impurity by means of ion implantation or the like after depositing a poly-crystalline silicon film and then implanting $4 \times 10^{19}$ atoms/cm$^3$ of phosphorus as a second impurity. Further, because the total amount of the impurities implanted is $7 \times 10^{19}$ atoms/cm$^3$, the dispersion caused by the impurity segregated at the grain boundary of the poly-crystalline silicon may be significantly reduced because the impurity concentration is higher that much as compared to the case when N conductive impurity is simply implanted by $1 \times 10^{19}$ atoms/cm$^3$.

Figure 27:
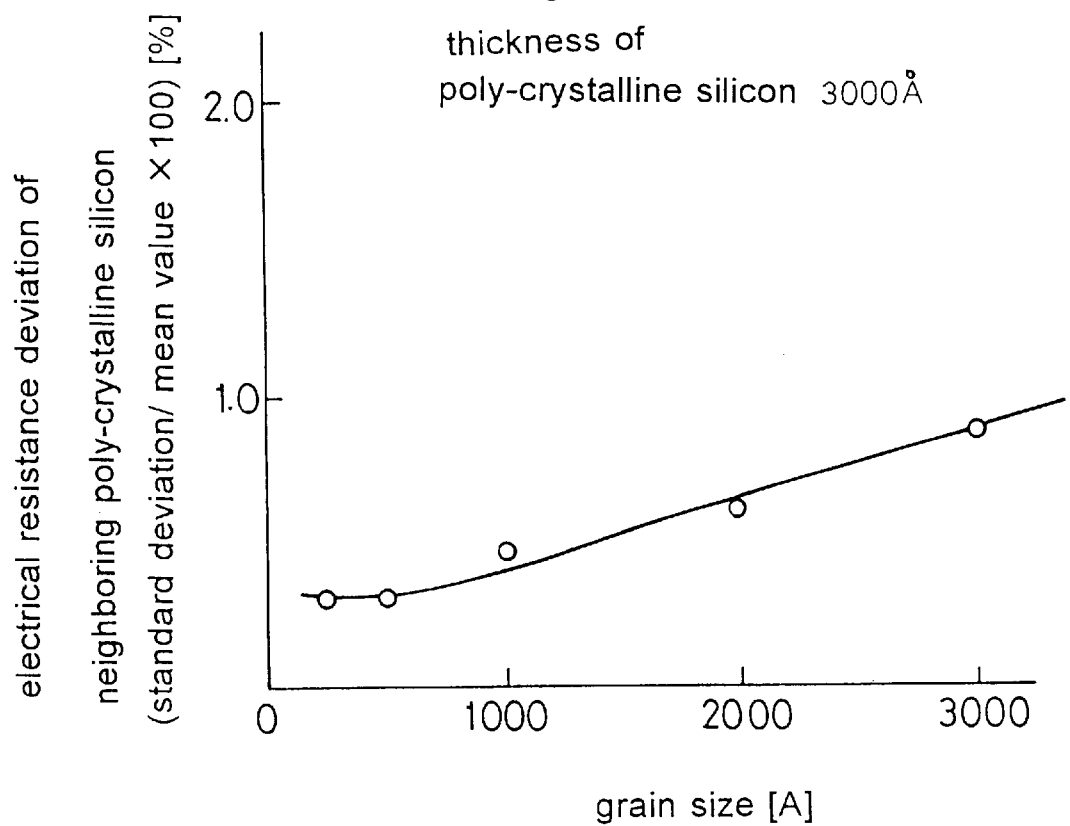
FIG. 27 is a graph representing a grain size and a dispersion of adjoining poly-crystalline silicon resistors for forming the low-concentrate poly-crystalline silicon resistor of the present invention.

The dispersion of the resistance value of the poly-crystalline silicon caused by the impurity concentration, amount of implanted impurity or the like described so far appears as a dispersion of resistance value within the substrate wafer for forming the poly-crystalline silicon, between the substrate wafer or between processing lots. However, an influence of the grain size of the poly-crystalline silicon cannot be ignored for the dispersion of resistance value within a very small area within 1 mm for example or among neighboring resistors. FIG. 27 shows a characteristic of dispersion of resistance values of three resistors formed neighboring from each other. It can be seen from the figure that the smaller the grain size, the smaller the dispersion of resistance values becomes. The resistance value of the poly-crystalline silicon may be said that it is a resistance value determined by a serial or parallel circuit of resistance value which each grain composing the poly-crystalline silicon resistor has. Due to that, the dispersion of resistance values is influenced by the grain size as described above.

For example, when an average grain size is 3000 Å, actually grains having a size of about 100 to 3000 Å are distributed in the gap between the grains. Due to that, grains existing in a poly-crystalline silicon resistor are dispersed in a range of 100 to 3000 Å and because this dispersion of grain size differs among neighboring poly-crystalline silicon resistors, the dispersion of resistance value as described before is brought about. When the average grain size is small, the dispersion of the resistance value becomes small because the dispersion range is small. Although a total number of grains existing in a poly-crystalline silicon resistor having a certain length and width, e.g. the minimum resistor used in the ladder resistor circuit described above, differs among each poly-crystalline silicon resistor, the dispersion of resistance value when one grain changes becomes large relatively when the grain size is large because there exists less number of grains within the minimum resistor. Due to that, the dispersion of resistance value caused by such grain size appears remarkably when the poly-crystalline silicon resistor is refined.

The grain of the poly-crystalline silicon owes a lot to a condition for forming the poly-crystalline silicon. However, when the average grain size of the poly-crystalline silicon is less than 200 Å, a rate when the grain size changes becomes large due to an influence of a post-processing such as a heat treatment after the formation of the poly-crystalline silicon, it is best formed so as to have a grain size between 200 to 1000 Å to be used as the poly-crystalline silicon resistor.

The grains composing the poly-crystalline silicon becomes large along its growth time. Due to that, a poly-crystalline silicon whose thickness is thinner has a smaller average grain size as compared to a poly-crystalline silicon whose thickness is thick. Therefore, it can be said that the thinner poly-crystalline silicon used as the resistor has less dispersion of resistance value from the aspect of the grain size.

Figure 28:
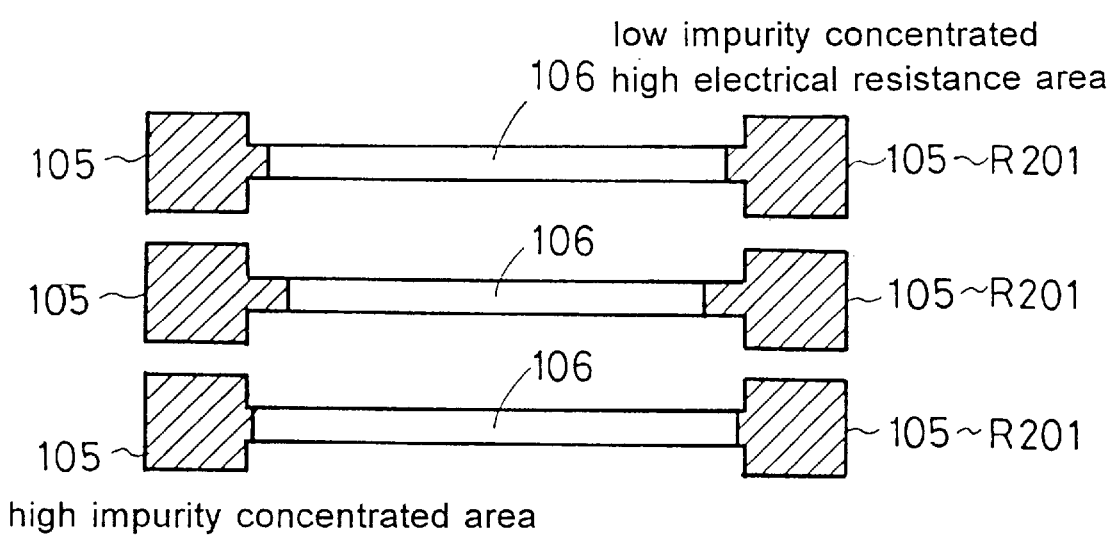
FIG. 28 is a diagrammatic plan view showing the low-concentrate poly-crystalline silicon resistor of the present invention.

Further, as described before, when the length of the minimum resistor formed out of the poly-crystalline silicon is shortened, generally the dispersion of resistance value of the minimum resistor increases as shown in FIG. 24. It is because an influence of diffused dispersion due to a heat treatment of a high-concentrate impurity area 105 or the like for obtaining an ohmic contact formed at the edge of the minimum resistor R 201 as shown in FIG. 28 becomes large together with the influence of the grain size described above along the shortening of the length of the minimum resistor. When the diffused dispersion of the high-concentrate impurity area 105 is large, the dispersion of resistance value increases because a dispersion of length of a low-concentrate high-resistance area 106 existing between two high-concentrate impurity areas 105 within one minimum resistor increases. The increase of the dispersion of resistance value caused when the length of the poly-crystalline silicon resistor is shortened as shown in FIG. 24 may be suppressed by reducing the diffusion itself.

Figure 29:
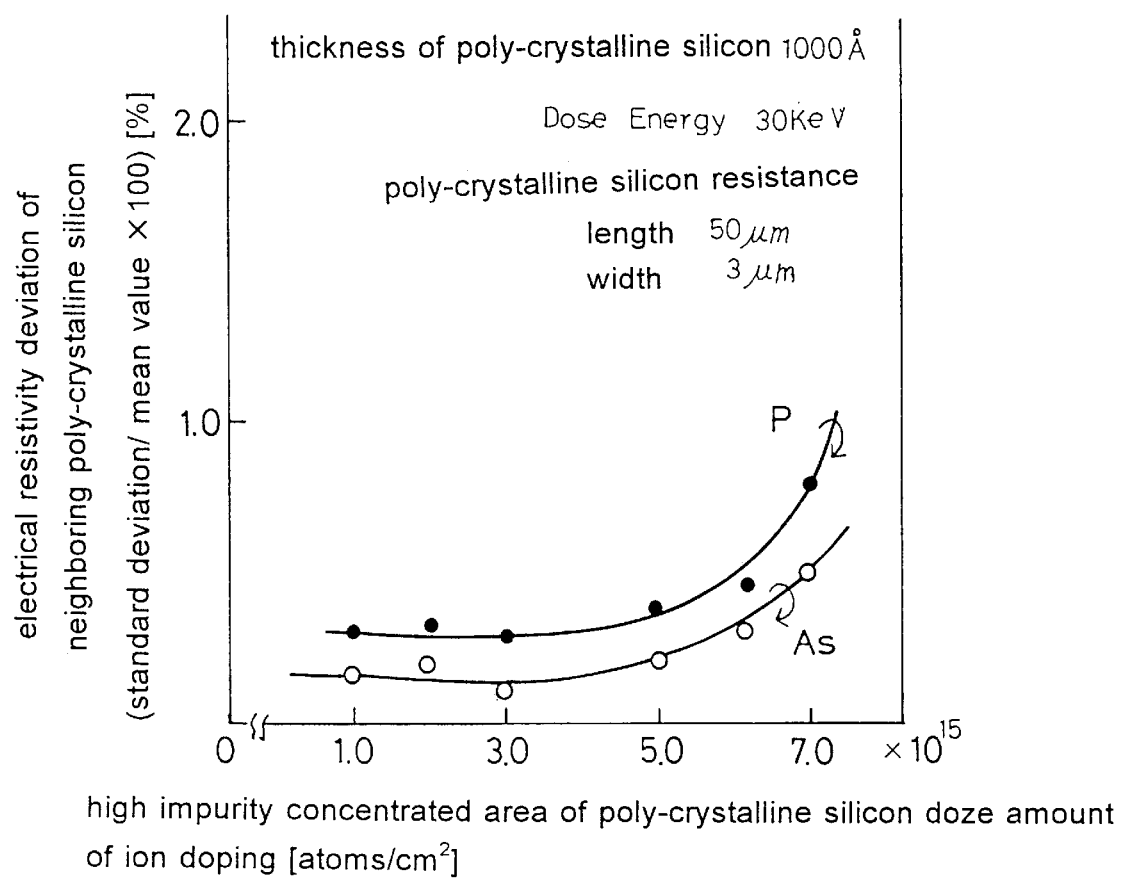
FIG. 29 is a graph showing a relationship between an ion dose implanted to a high-concentrate area formed at a part of the poly-crystalline silicon resistor and the dispersion of adjoining poly-crystalline silicon resistors of the present invention.
Figure 30:
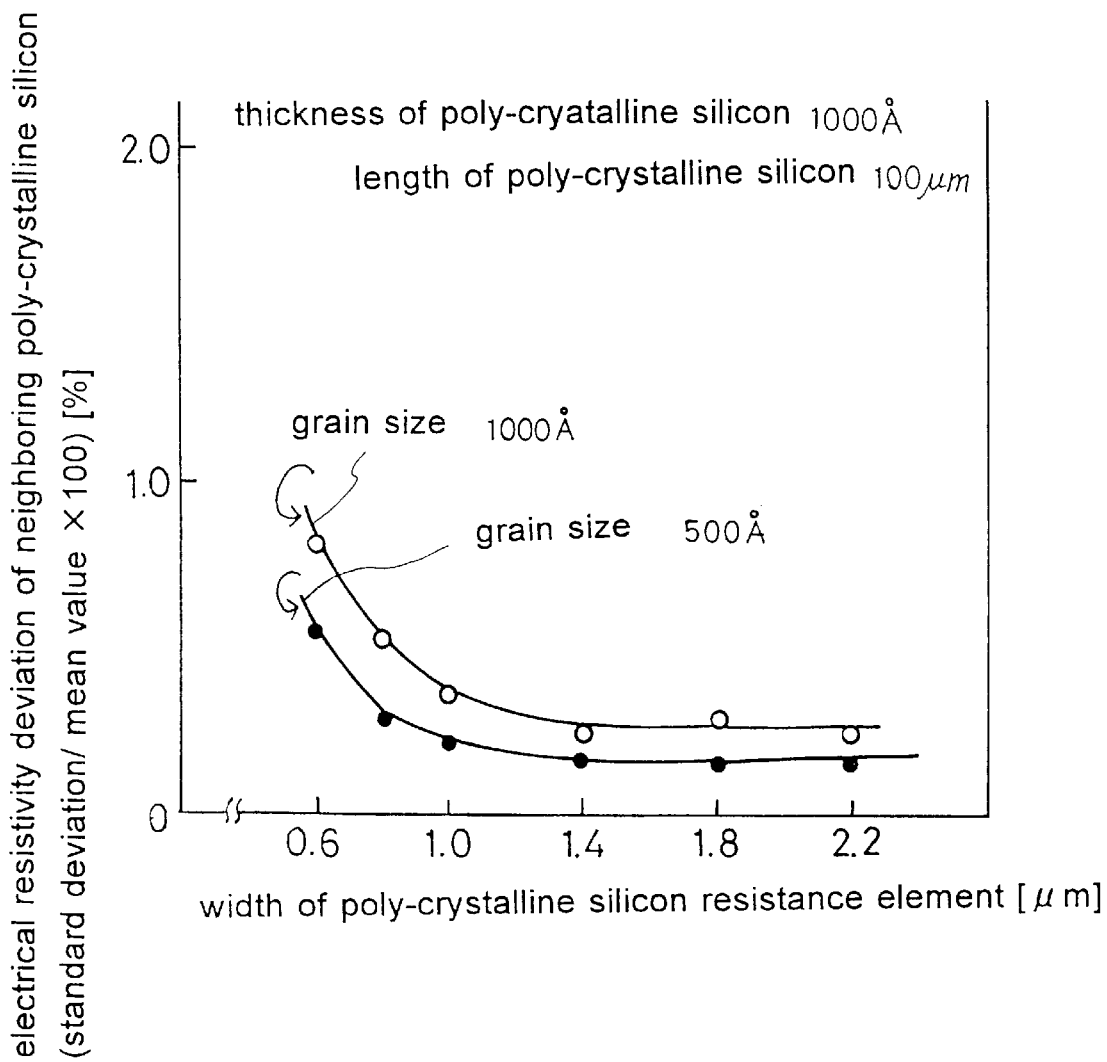
FIG. 30 is a graph showing a relationship between a width of poly-crystalline silicon resistor and the dispersion of adjoining poly-crystalline silicon resistors of the present invention.
Figure 31:
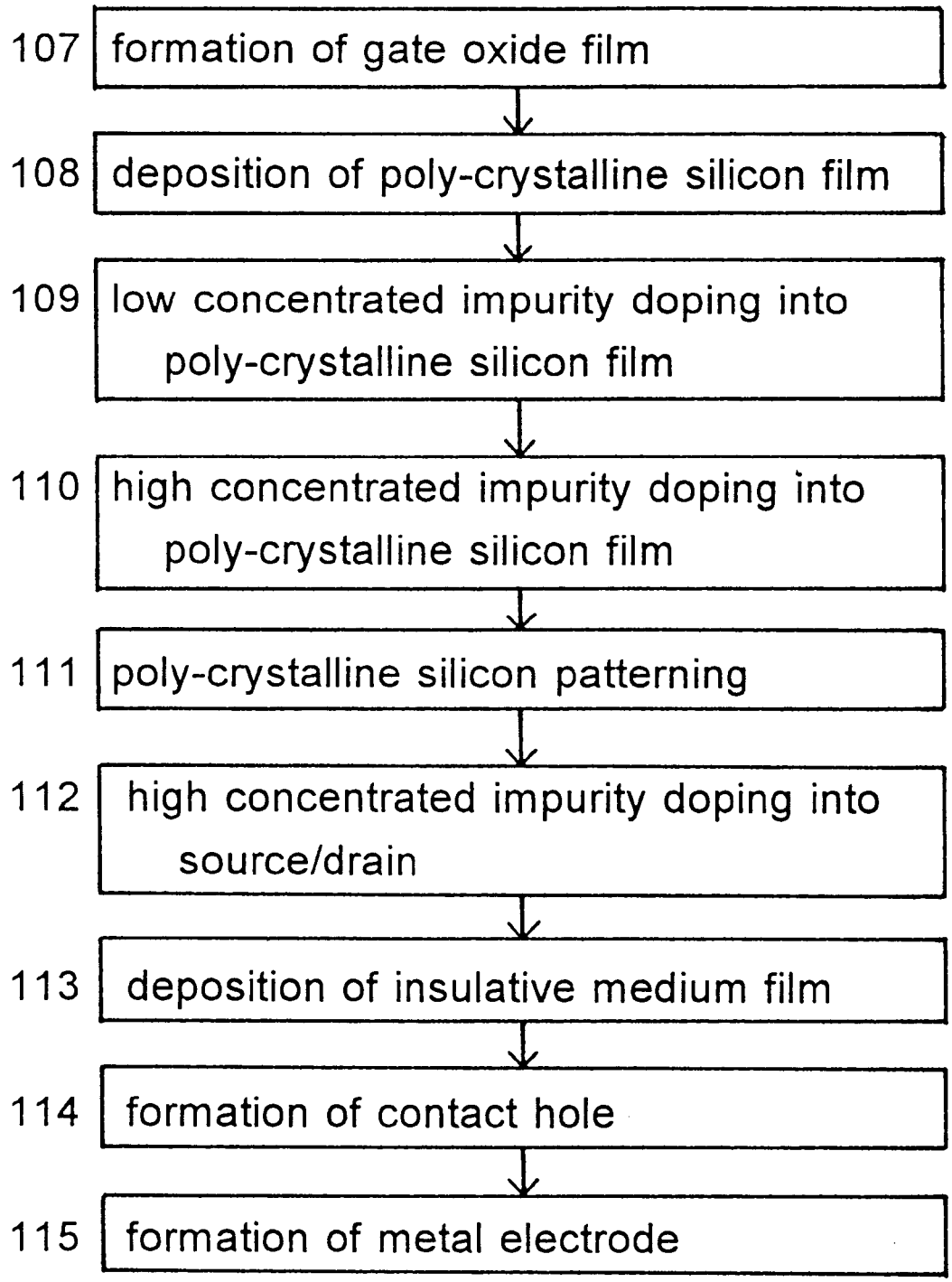
FIG. 31 is a process block diagram showing a manufacturing method of a resistor element of a prior art semiconductor integrated circuit.

For example, the dispersion of resistance value may be reduced by using arsenic, instead of phosphorus, as the high-concentrate impurity described above for forming on a part of the poly-crystalline silicon resistor. Because arsenic has a smaller diffusion coefficient, the fact that the diffusion and diffused dispersion caused by the heat treatment or the like are small is utilized. Further, the diffusion and diffused dispersion may be reduced and the dispersion of resistance value may be suppressed similarly by lowering the concentration of the impurity in the high-concentrate impurity area described above. FIG. 29 shows the dispersion of resistance value of poly-crystalline silicon vs. a dosage to be implanted to the high-concentrate impurity area. However, the dispersion of the resistance value of the poly-crystalline silicon here is what dispersions of three resistors formed adjoining from each other are represented using an average and a standard deviation of the resistance values. It can be seen from FIG. 29 that the dispersion of resistance value may be reduced by reducing the dosage implanted to the high-concentrate impurity area to less than $5\times10^{15}$ atoms/cm$^3$. It is because the reduction of the concentration of the high-concentrate impurity area reduces the diffusion and its dispersion of the high-concentrate impurity area. However, when the implanted ion amount is reduced to less than $1\times10^{15}$ atoms/cm$^3$, the resistance value which the high-concentrate impurity area has increases and the resistant component in the high-concentrate impurity area to the whole resistance value of the poly-crystalline silicon resistor cannot be ignored, so that it is best selected in a range of 2 to $5\times10^{15}$ atoms/cm$^3$.

Further, the width of the poly-crystalline silicon resistor is better to be short as much as possible because the increase of the resistance value and the reduction of the area may be realized in the same time by shortening it. ig. 30 shows a relationship between the width of the poly-crystalline silicon resistor and the dispersion of resistance values of neighboring resistors. It can be seen from the figure that when the width of the poly-crystalline silicon resistor is reduced to less than 1.0 $\mu$m, the dispersion of resistance value sharply increases. When the width of the poly-crystalline silicon resistor is reduced, the influence of the grain size becomes significant and the dispersion of resistance value increases. Still more, because the resistance value of the poly-crystalline silicon is proportional to an inverse number of the resistor width, the dispersion of resistance value sharply increases along the reduction of the width. Because dispersions in photolithographic process and etching process are superimposed on this dispersion of resistance value, the minimum width of the poly-crystalline silicon resistor may be best set between 1.2 to 1.4 $\mu$m.

The present invention allows to realize a ladder resistor having a large resistance value with a small area. Further, it allows to form a gate electrode of a MISFET and a capacitor electrode provided the same substrate may be formed readily in the same process.

What is claimed is:

1. A semiconductor device having a ladder resistor, comprising: a support substrate; at least one first resistor made from a first polycrystalline silicon film provided on the support substrate; a first insulating film provided on the first polycrystalline silicon film; at least one second resistor made from a second polycrystalline silicon film provided apart from the at least one first resistor via the first insulating film, the second polycrystalline silicon film being connected to the first polycrystalline silicon film; a second insulating film provided over the second polycrystalline silicon film; and metal wires provided on a surface of the second polycrystalline silicon film via contact holes formed in the second insulating film; wherein the first polycrystalline silicon film is thicker than the second polycrystalline silicon film, an impurity concentration of the first polycrystalline silicon film is higher than an impurity concentration of the second polycrystalline silicon film, and a grain size of the first polycrystalline silicon film is larger than a grain size of the second polycrystalline silicon film.

2. A semiconductor device according to claim 1; wherein the first polycrystalline silicon film and the second polycrystalline silicon film partially but not entirely overlap each other, and the first polycrystalline silicon film is electrically connected with the second polycrystalline silicon film through one or more contact holes formed within the first insulating film at a portion where the first and second polycrystalline silicon films overlap each other.

3. A semiconductor device according to claim 1; further comprising first and second terminals; a resistor divider circuit disposed between the first and second terminals; and a third terminal connected between the first and second terminals such that the resistor divider circuit outputs a voltage applied between the first terminal and the second terminal to the third terminal; wherein the first terminal is electrically connected with one of the first polycrystalline silicon film and the second polycrystalline silicon film the second terminal is electrically connected with the other one of the first polycrystalline silicon film and the second polycrystalline silicon film, and the resistor divider circuit comprises two or more of the first and second resistors formed in the first polycrystalline silicon film and the second polycrystalline silicon film and has an electrical connection between the first terminal and the second terminal.

4. A semiconductor device according to claim 3; wherein the third terminal is electrically connected to the resistor divider circuit through a contact hole formed in at least one of the second and third insulating films.

5. A semiconductor device according to claim 3; wherein the resistor divider circuit comprises one or more of the first resistors, a first contact hole formed in the first insulating film to connect the first polycrystalline silicon film and the second polycrystalline silicon film between the first and second terminals, one or more of the second resistors, and a second contact hole formed in the first insulating film to connect the first polycrystalline silicon film and the second polycrystalline silicon film between the second and third terminals.

6. A semiconductor device according to claim 1; wherein the support substrate comprises a semiconductor substrate having an insulating layer thereon, and the first polycrystalline silicon film is formed over the insulating layer formed on the semiconductor substrate; and further comprising an insulated gate field effect transistor formed in the semiconductor substrate and comprising a source area, a drain area, and a gate electrode provided over the source and drain areas via the insulating film formed on the semiconductor substrate; wherein the gate electrode is formed from the first polycrystalline silicon film and the insulated gate field effect transistor is electrically connected to at least one of the first polycrystalline silicon film and the second polycrystalline silicon film.

7. A semiconductor device according to claim 1; wherein one or more of the resistor elements comprises a pair of low-resistance impurity areas formed spaced apart from each other in one of the first and second polycrystalline silicon films, a second resistor impurity area formed in a high-resistance polycrystalline silicon region disposed between and connected to the low-resistance impurity areas, and metal electrodes provided on the pair of low-resistance impurity areas.

8. A semiconductor device according to claim 1; wherein the first polycrystalline silicon film has a thickness within the range of approximately 2000 Å–4000 Å.

9. A semiconductor device according to claim 1; wherein the first polycrystalline silicon film has an impurity concentration greater than approximately $10^{20}$ atoms/cm$^3$.

10. A semiconductor device according to claim 1; wherein the second insulating film comprises a Nondoped Silicate Glass having a thickness within the range of approximately 1000 Å–4000 Å.

11. A semiconductor device according to claim 1; wherein the second polycrystalline silicon film has a thickness within the range of approximately 100 Å–1000 Å.

12. A semiconductor device according to claim 1; wherein the second polycrystalline silicon film has an impurity concentration within the range of approximately $10^{15}$–$5\times10^{19}$ atoms/cm$^3$.

13. A semiconductor device according to claim 1; wherein the second polycrystalline silicon film has low-resistance impurity areas for ohmic contact having an impurity concentration greater than approximately $10^{20}$ atoms/cm$^3$.

14. A semiconductor device according to claim 1; wherein the second insulating film comprises a thermally grown oxide film having a thickness within the range of approximately 200 Å–700 Å.

15. A semiconductor device according to claim 1; wherein the support substrate comprises an insulating substrate.

16. A semiconductor device according to claim 1; wherein the support substrate comprises a semiconductor substrate having an insulating layer thereon, the first polycrystalline silicon layer being formed on the insulating layer.

17. A semiconductor device according to claim 1; wherein a thickness of the second polycrystalline silicon film is 500 Å±100 Å.

18. A semiconductor device according to claim 1; wherein selected ones of the first and second resistors of the resistor ladder comprise identical resistors each being formed in the same polycrystalline silicon film and having the same resistance value and the same physical dimensions and dopant characteristics; and further comprising a low resistance polycrystalline fuse connected in parallel with selected identical resistors so that resistors forming the resistor ladder may be selected from the identical resistors by opening a corresponding fuse.

19. A semiconductor device comprising: a semiconductor substrate; a first insulating film formed on the semiconductor substrate; a first polycrystalline silicon film formed on the first insulating film; an interlayer insulating film formed on the first polycrystalline silicon film; a second polycrystalline silicon film formed on the interlayer insulating film; an insulated gate field effect transistor having a gate electrode comprised of the first polycrystalline silicon film; and a resistor ladder circuit formed in the second polycrystalline silicon film; wherein the thickness of the first polycrystalline silicon film is within the range of approximately 2000 to 4000 Å, an impurity concentration of the first polycrystalline silicon film is more than $10^{20}$ atoms/cm$^3$, the first polycrystalline silicon film is thicker than the second polycrystalline silicon film and a grain size of the first polycrystalline silicon film is larger than a grain size of the second polycrystalline silicon film.

20. A semiconductor device according to claim 19; wherein a thickness of the second polycrystalline silicon film is within the range of 100 to 1000 Å and the impurity concentration thereof is approximately from $1\times10^{15}$ atoms/cm$^3$ to $5\times10^{19}$ atoms/cm$^3$.

21. A semiconductor device according to claim 19; wherein the interlayer insulating film comprises a Nondoped Silicate Glass having a thickness within the range of 1000 to 4000 Å.

22. A semiconductor device according to claim 19; wherein the interlayer insulating film is a thermal oxide film having a thickness of 200 to 700 Å.

23. A semiconductor device according to claim 19; wherein a thickness of the second polycrystalline silicon film is 500 Å±100 Å.

24. A semiconductor device comprising: a semiconductor substrate; a first insulating film formed on the semiconductor substrate; a first polycrystalline silicon film formed on the first insulating film; at least one first resistor element formed in the first polycrystalline silicon film; a second insulating film formed on the first polycrystalline silicon film; a second polycrystalline silicon film formed on the second insulating film, the second polycrystalline silicon film having a grain size smaller than that of the first polycrystalline silicon film and being connected to the first polycrystalline silicon film through one or more via holes formed in the second insulating film; and at least one second resistor element formed in the second polycrystalline silicon film; wherein the first polycrystalline silicon film is thicker than the second polycrystalline silicon film, and an impurity concentration of the first polycrystalline silicon film is higher than an impurity concentration of the second polycrystalline silicon film.

25. A semiconductor device according to claim 24; wherein the first polycrystalline silicon film and the second polycrystalline silicon film at least partially overlap each other and the first polycrystalline silicon film is electrically connected with the second polycrystalline silicon film through one or more contact holes formed within the second insulating film at a portion where the first and second polycrystalline silicon films overlap each other.

26. A semiconductor device according to claim 24; further comprising first and second terminals; a resistor divider circuit disposed between the first and second terminals; and a third terminal connected between the first and second terminals such that the resistor divider circuit divides a voltage applied across the first terminal and the second terminal and outputs the divided voltage to the third terminal; wherein the first terminal is electrically connected with one of the first polycrystalline silicon film and the second polycrystalline silicon film, the second terminal is electrically connected with the other one of the first polycrystalline silicon film and the second polycrystalline silicon film, and the resistor divider circuit comprises two or more of the first and second resistors formed in the first polycrystalline silicon film and the second polycrystalline silicon film.

27. A semiconductor device according to claim 26; wherein the resistor divider circuit comprises one or more of the first resistors, a first contact hole formed in the second insulating film through which the first polycrystalline silicon film and the second polycrystalline silicon film are connected between the first and third terminals, one or more of the second resistors, and a second contact hole formed in the second insulating film through which the first polycrystalline silicon film and the second polycrystalline silicon film are connected between the second and third terminals.

28. A semiconductor device according to claim 24; further comprising an insulated gate field effect transistor formed in the semiconductor substrate and comprising a source area, a drain area, and a gate electrode provided over the source and drain areas via an insulating film; wherein the gate electrode is formed from the first polycrystalline silicon film and the insulated gate field effect transistor is electrically connected to at least one of the first and second resistors.

29. A semiconductor device according to claim 24; further comprising an insulated gate field effect transistor having a gate electrode formed using the first polycrystalline silicon film; wherein the thickness of the first polycrystalline silicon film is within the range of 2000 Å to 4000 Å and an impurity concentration of the first polycrystalline silicon film is more than $10^{20}$ atoms/cm$^3$.

30. A semiconductor device according to claim 24; further comprising reference voltage generating means for generating a reference voltage, voltage comparison means for comparing voltages, voltage dividing means for dividing a voltage and output means for providing an output, the voltage comparison means including means for inputting and comparing at least a voltage generated by the reference voltage generating means and a voltage output by the voltage dividing means and for outputting a signal which corresponds to a difference of said two voltages to the output means; wherein the voltage dividing means comprises one or more of the first resistors and one or more of the second resistors.

31. A semiconductor device according to claim 24; wherein a thickness of the second polycrystalline silicon film is 500 Å±100 Å.

32. A semiconductor device comprising: a semiconductor substrate; a first insulating film formed on the semiconductor substrate; a first polycrystalline silicon film formed on the first insulating film; a second insulating film formed on the first polycrystalline silicon film; a second polycrystalline silicon film formed on the second insulating film and electrically connected with the first polycrystalline silicon film, the second polycrystalline silicon film having a smaller thickness and a smaller grain size than the first polycrystalline silicon film; metal electrodes provided on the first and second polycrystalline silicon films; a plurality of identical resistors formed in the second polycrystalline silicon film, each having the same resistance value and the same physical dimensions and dopant characteristics; and a low resistance polycrystalline fuse connected in parallel with selected identical resistors so that resistors forming the resistor ladder may be selected from the identical resistor by opening a corresponding fuse.

33. A semiconductor device according to claim 32; wherein the second insulating film comprises a Nondoped Silicate Glass having a thickness within the range of approximately 1000 Å to 4000 Å.

34. A semiconductor device according to claim 32; wherein the second insulating film is a thermal oxide film having a thickness within the range of approximately 200 Å to 700 Å.

35. A semiconductor device according to claim 32; wherein a thickness of the second polycrystalline silicon film is 500 Å±100 Å.

36. A semiconductor device having a resistor ladder in which a plurality of resistor elements are connected in series, one or more of the resistor elements comprising: a semiconductor substrate; an insulating film; a pair of low-resistance impurity areas formed spaced apart from each other in a first polycrystalline silicon film formed on the insulating film; a resistor impurity area formed in a second polycrystalline silicon film disposed between and connected to the low-resistance impurity areas and provided on the semiconductor substrate via the insulating film, the second polycrystalline silicon film having a higher resistance than the first polycrystalline silicon film, and having a smaller grain size than the first polycrystalline silicon film so as to suppress a dispersion in resistance value of the second polycrystalline silicon film; and metal electrodes provided on the pair of low-resistance impurity areas; wherein a thickness of the second polycrystalline silicon film is within the range of 100 to 1000 Å and the impurity concentration thereof is within the range of approximately $1 \times 10^{18}$ atoms/$cm^3$ to $5 \times 10^{19}$ atoms/$cm^3$.

37. A semiconductor device according to claim 36; wherein the second polycrystalline silicon film is thinner than the first polycrystalline silicon film.

38. A semiconductor device according to claim 36; wherein a thickness of the second polycrystalline silicon film is 500 Å±100 Å.

39. A semiconductor device according to any one of claims 1, 2, 2, 4–6, 7–19 and 20–21; further comprising reference voltage generating means, voltage comparison means, voltage dividing means and output means, the voltage comparison means including means for inputting and comparing at least a voltage generated by the reference voltage generating means and a voltage output by the voltage dividing means and for outputting a signal which corresponds to a difference of said two voltages to the output means; wherein the voltage dividing means comprises one or more of the first resistors and one or more of the second resistors.

* * * * *